(12) United States Patent
You et al.

(10) Patent No.: US 10,074,441 B2
(45) Date of Patent: Sep. 11, 2018

(54) MEMORY DEVICE AND OPERATING METHOD THEREOF

(71) Applicant: SK hynix Inc., Gyeonggi-do (KR)

(72) Inventors: Byoung-Sung You, Gyeonggi-do (KR); Jae-Hyoung Ko, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 325 days.

(21) Appl. No.: 15/174,748

(22) Filed: Jun. 6, 2016

(65) Prior Publication Data

US 2017/0162273 A1    Jun. 8, 2017

(30) Foreign Application Priority Data

Dec. 4, 2015    (KR) ........................ 10-2015-0172401

(51) Int. Cl.
| | |
|---|---|
| *G11C 16/34* | (2006.01) |
| *G06F 12/02* | (2006.01) |
| *G11C 16/10* | (2006.01) |
| *G11C 16/28* | (2006.01) |
| *G11C 16/30* | (2006.01) |
| *G11C 16/04* | (2006.01) |

(52) U.S. Cl.
CPC ........ *G11C 16/349* (2013.01); *G06F 12/0253* (2013.01); *G11C 16/0483* (2013.01); *G11C 16/10* (2013.01); *G11C 16/28* (2013.01); *G11C 16/30* (2013.01); *G11C 16/3445* (2013.01); *G11C 16/3459* (2013.01); *G06F 2212/7205* (2013.01)

(58) Field of Classification Search
CPC .............. G11C 16/344; G11C 16/3495; G11C 16/3445; G11C 16/3436; G11C 16/3454; G11C 16/3459; G11C 16/349
See application file for complete search history.

(56) References Cited

U.S. PATENT DOCUMENTS

| | | | | |
|---|---|---|---|---|
| 7,965,553 | B2 * | 6/2011 | Han | G11C 11/5628 |
| | | | | 365/185.09 |
| 9,053,810 | B2 * | 6/2015 | Dutta | G11C 16/3459 |
| 9,685,242 | B2 * | 6/2017 | Sugiyama | G11C 29/52 |
| 2007/0159890 | A1 | 7/2007 | Cho | |

* cited by examiner

*Primary Examiner* — Harry W Byrne
*Assistant Examiner* — R Lance Reidlinger
(74) *Attorney, Agent, or Firm* — IP & T Group LLP

(57) ABSTRACT

A memory device includes a pass/fail check circuit configured to compare the number of memory cells, which are verified as being a program fail based on a result of verifying program operations of a first group of memory cells of a plurality of memory cells, with a first reference bit number, and to check whether the first group of memory cells is a pass or fail and a control circuit configured to control the pass/fail check circuit to recheck whether the first group of memory cells is the pass or fail based on a second reference bit number smaller than the first reference bit number when the first group of memory cells is found to be the pass based on a result of a pass/fail check operation of the pass/fail check circuit.

20 Claims, 13 Drawing Sheets

MEMORY DEVICE AND OPERATING METHOD THEREOF

CROSS-REFERENCE TO RELATED APPLICATION

The present application claims priority of Korean Patent Application No. 10-2015-0172401, filed on Dec. 4, 2015, the disclosure of which is incorporated herein in its entirety by reference.

TECHNICAL FIELD

Exemplary embodiments of the present invention relate to a program/erase verification operation of a memory device and, more particularly, to a memory device for checking the state of a memory cell through a program/erase verification operation and an operating method thereof.

DISCUSSION OF THE RELATED ART

The computer environment paradigm has shifted to ubiquitous computing systems that can be used anytime and anywhere. Due to this, use of portable electronic devices such as mobile phones, digital cameras, and notebook computers has rapidly increased. These portable electronic devices use generally a memory system having one or more semiconductor memory devices for storing data, that is, a data storage device. The memory system may be used as a main or an auxiliary memory device of a portable electronic device.

Memory systems using semiconductor memory devices provide excellent stability, durability, high information access speed, and low power consumption, since unlike other type of data storage devices they have no moving parts. Examples of memory systems having such advantages include universal serial bus (USB) memory devices, memory cards having various interfaces, and solid state drives (SSD).

SUMMARY

Various embodiments of the present disclosure are directed to a memory device for checking the state of a memory cell through a program/erase verification operation and an operating method thereof.

In an embodiment of the present disclosure, a memory device may include a plurality of memory blocks each memory block comprising a plurality of memory cells, a read/write circuit suitable for reading data of a first group of memory cells of the plurality of memory cells and for verifying a program operation for each of the memory cells of the first group of memory cells, a pass/fail check circuit suitable for comparing a first reference bit number with a number of first memory cells among the first group of memory cells which are verified as being a program fail as a result of a verification operation of the read/write circuit, and for checking whether the first group of memory cells is a pass or fail, and a control circuit suitable for controlling the pass/fail check circuit to recheck whether the first group of memory cells is a pass or fail based on a second reference bit number smaller than the first reference bit number when the first group of memory cells is found to be the pass as a result of a pass/fail check operation of the pass/fail check circuit.

In an embodiment of the present disclosure, a memory device may include a plurality of memory blocks each comprising a plurality of memory cells, a read/write circuit suitable for reading data of the plurality of memory cells of each of the memory blocks and verifying an erase operation for the memory block, a pass/fail check circuit suitable for comparing a first reference bit number with a number of first memory cells among the plurality of memory cells which are verified as being an erase fail as a result of a verification operation of the read/write circuit, and checking whether the memory block is a pass or fail, and a control circuit suitable for controlling the pass/fail check circuit to recheck whether the memory block is a pass or fail based on a second reference bit number smaller than the first reference bit number when the memory block is found to be the pass as a result of a pass/fail check operation of the pass/fail check circuit.

In an embodiment of the present disclosure, an operating method of a memory device may include programming first group of memory cells of a plurality of memory cells by applying a program voltage thereto, verifying a program state of each of the first group of memory cells, comparing a first reference bit number with a number of first memory cells which are verified as being a program fail as a result of the verifying of the program state, among the first group of memory cells, and checking whether the first group of memory cells is a pass or fail, and rechecking whether the first group of memory cells is a pass or fail based on a second reference bit number smaller than the first reference bit number when the first group of memory cells is found to be the pass as a result of the checking of the first group of memory cells.

DETAILED DESCRIPTION

Figure 1:
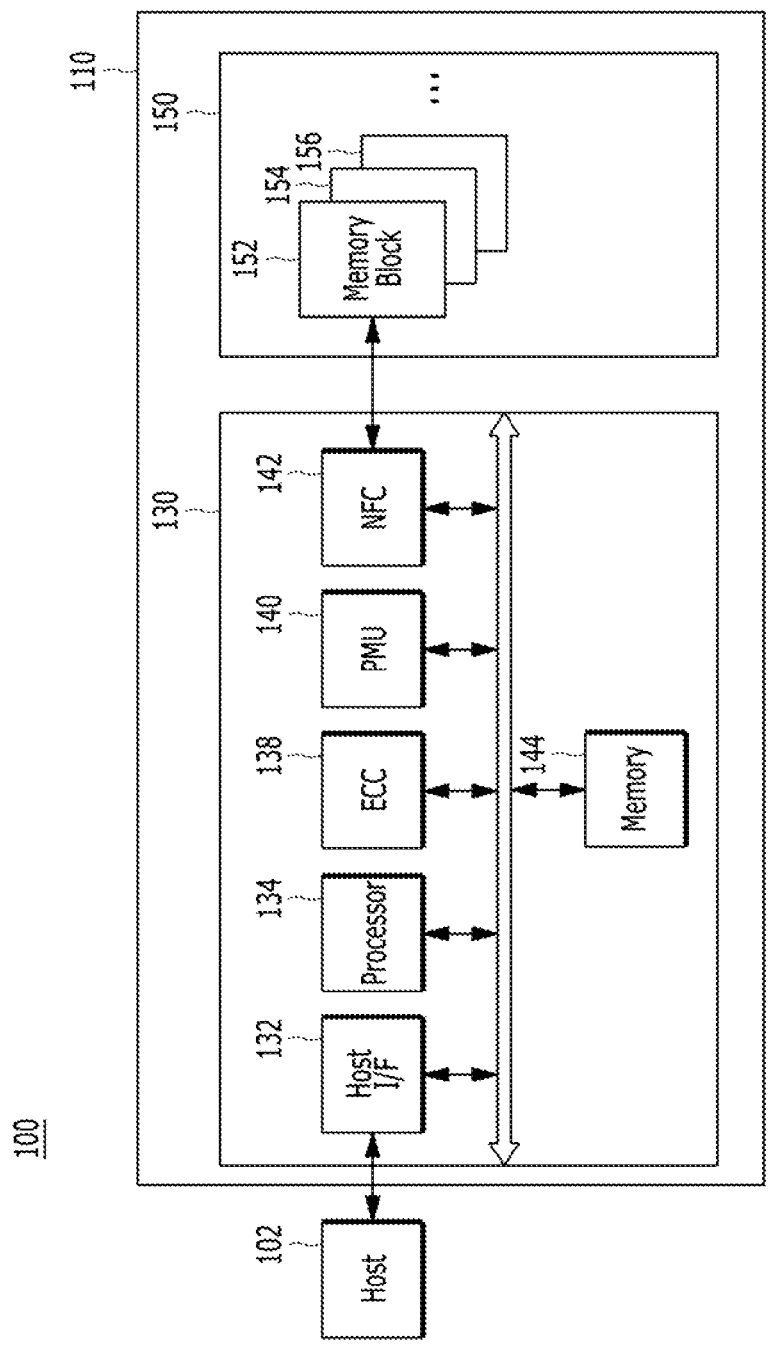
FIG. 1 is a diagram illustrating a data processing system including a memory system according to an embodiment of the present invention.

Various embodiments will be described with reference to the accompanying drawings. It is noted, however, that the present invention may be embodied in different forms and should not be construed as being limited to the embodiments set forth herein. Rather, these embodiments are provided so that this disclosure will be thorough and complete, and will fully convey the present invention to those skilled in the art.

Throughout the disclosure, like reference numerals are used to refer to like parts in the various figures and embodiments of the present invention.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be further understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Also, the terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof. As used herein, the term "and/or" includes any and all combinations of one or more of the associated listed items.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure. Hereinafter, the various embodiments of the present disclosure will be described in details with reference to the drawings.

Referring now to FIG. 1, a data processing system 100 is provided, according to an embodiment of the present invention. The data processing system 100 may include a host 102 and a memory system 110.

The host 102 may include any suitable electronic device. For example, the host 102 may include a portable electronic device such as a mobile phone, an MP3 player, a laptop computer and the like. The host may include a non-portable electronic device such as a desktop computer, a game player, a TV, a projector and the like.

The memory system 110 may store data to be accessed by the host 102 in response to a request from the host 102. The memory system 110 may be used as a main memory system or an auxiliary memory system of the host 102. The memory system 110 may be implemented to be coupled electrically with the host 102, according to a protocol of a host interface. One or more semiconductor memory devices may be used. Volatile or non-volatile memory devices may be used. For example, the memory system 110 may be implemented with a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, such as a dynamic random access memory (DRAM), a static random access memory (SRAM) and the like. Alternatively, the storage devices for the memory system 110 may be implemented a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), a resistive RAM (RRAM) and the like.

The memory system 110 may include a memory device 150 for storing data and a controller 130 for controlling storage of data in the memory device 150. The stored data in the memory device 150 may be accessed by the host 102.

The controller 130 and the memory device 150 may be integrated into a single semiconductor device. For instance, the controller 130 and the memory device 150 may be integrated into a semiconductor device configured as a solid state drive (SSD). Configuring the memory system 110 as a SSD, may generally allow a significant increase in an operation speed of the host 102.

The controller 130 and the memory device 150 may be integrated into a semiconductor device configured as a memory card, such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, a universal flash storage (UFS) device and the like.

Also, for example, the memory system 110 may be or comprise a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, one of various component elements configuring a computing system and the like.

The memory device 150 may store data provided from the host 102. During a read operation, the memory device 150 may provide the stored data to the host 102. One or more memory devices 150 may be employed. The one or more memory devices 150 may be substantially identical. The one or more memory devices may be different memory devices. The memory device 150 may include one or more memory blocks 152, 154 and 156. Each of the memory blocks 152, 154 and 156 may include a plurality of pages. Each of the pages may include a plurality of memory cells coupled electrically to a plurality of word lines (WL). The memory device 150 may be a nonvolatile memory device capable of retaining stored data even when a power supply is interrupted or turned off. According to an embodiment, the memory device may be a flash memory. The memory device may be a flash memory device having a three-dimensional (3D) stack structure. Examples of a non-volatile memory device 150 having a three-dimensional (3D) stack structure are described later herein with reference to FIGS. 2 to 11.

The controller 130 may control the overall operation of the memory device 150, such as, read, write, program and/or erase operations. Generally, the controller 130 may control the memory device 150 in response to a request from the host 102. For example, the controller 130 may provide data read from the memory device 150, to the host 102, in response to a read request from the host 102. Or, also as an example, the controller may store data provided from the host 102 into the memory device 150 in response to a write request.

Any suitable controller may be used. For example, the controller 130 may include a host interface unit 132, a processor 134, an error correction code (ECC) unit 138, a power management unit (PMU) 140, a NAND flash controller (NFC) 142, and a memory 144.

The host interface unit 132 may process commands and/or data provided from the host 102. The host interface unit 132 may communicate with the host 102 through at least one of various interface protocols, such as a universal serial bus (USB), a multimedia card (MMC), a peripheral component interconnect-express (PCI-E), a serial attached SCSI (SAS), a serial advanced technology attachment (SATA), a parallel advanced technology attachment (PATA), a small computer system interface (SCSI), an enhanced small disk interface (ESDI), integrated drive electronics (IDE) and the like. The host interface unit 132 may include any suitable circuits, systems or devices suitable for communicating with the host 102 and the other components of the controller 130 as may be needed.

The ECC unit 138 may detect and correct errors of the data read from the memory device 150 during a read operation. Various detection and correction techniques may be employed. For example, if the number of the error bits detected by the ECC unit 138 is greater than or equal to a threshold number of correctable error bits, the ECC unit 138 may not correct the error bits and output an error correction fail signal indicating failure in correcting the error bits.

The ECC unit 138 may perform an error correction operation based on any suitable error correction scheme. For example, the ECC unit 138 may perform an error correction operation based on a coded modulation scheme, such as, for example, a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and the like. The ECC unit 138 may include any suitable circuits, systems or devices required for an error detection and correction operation.

The PMU 140 may provide and manage electric power for the controller 130. For example, the PMU 140 may provide and manage electric power for the various components of the controller 130 as may be needed.

The NFC 142 may serve as a memory interface between the controller 130 and the memory device 150 to allow the controller 130 to control the memory device 150 in response to a request from the host 102. For example, the NFC 142 may generate control signals for the memory device 150. The NFC may process data under the control of the processor 134, for example, when the memory device 150 is a flash memory especially a NAND flash memory.

The memory 144 may serve as a working memory of the memory system 110 and the controller 130, and store data for driving the memory system 110 and the controller 130. For example, when the controller 130 controls the operations of the memory device 150, the memory 144 may store data used by the controller 130 and the memory device 150 for such operations as read, write, program and erase operations.

The memory 144 may be or comprise a volatile memory. For example, the memory 144 may be or comprise a static random access memory (SRAM) or a dynamic random access memory (DRAM). As described above, the memory 144 may store data used by the host 102 and the memory device 150 for read and/or write operations. The memory 144 may be or comprise a program memory, a data memory, a write buffer, a read buffer, a map buffer, and the like.

The processor 134 may control the general operations of the memory system 110. For example, the processor 134 may control a write operation for the memory device 150, in response to a write request from the host 102. Also, for example, the processor 134 may control a read operation for the memory device 150, in response to a read request from the host 102. The processor 134 may drive a firmware, also referred to as a flash translation layer (FTL), for controlling the general operations of the memory system 110. The processor 134 may be implemented with a microprocessor, a central processing unit (CPU) and the like. Any suitable processor may be used.

For example, a management unit (not shown) may be included in the processor 134 for performing bad block management of the memory device 150. Accordingly, the management unit may find bad memory blocks included in the memory device 150, i.e., memory blocks which are in an unsatisfactory condition for further use, and perform a bad block management operation the bad memory blocks. For example, when a flash memory, such as a NAND flash memory is employed as the memory device 150, a program failure may occur during a write operation due to inherent characteristics of a NAND logic function. During a bad block management, the data of the program-failed memory blocks (e.g., the bad memory blocks) may be programmed into a new memory block. The bad blocks due to a program fail may seriously deteriorate the utilization efficiency of a memory device, especially one having a 3D stack structure and thus negatively affect the reliability of the memory system 110.

Figure 2:
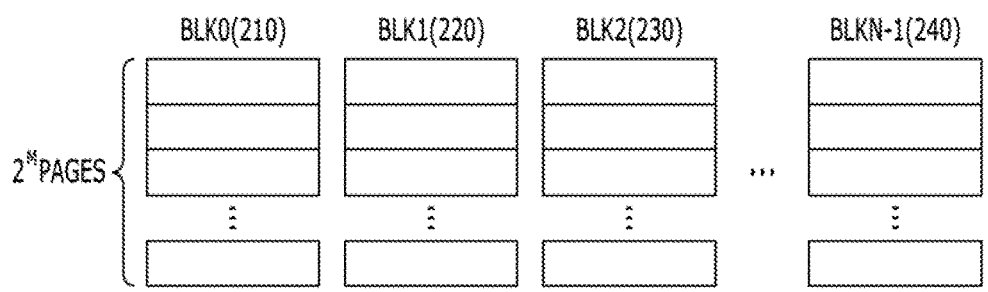
FIG. 2 is a diagram illustrating a memory device employed in the memory system of FIG. 1.

Referring to FIG. 2 the memory device 150 may include a plurality of memory blocks, for example, zeroth to $(N-1)^{th}$ blocks 210 to 240, where N is a positive integer. Each of the plurality of memory blocks 210 to 240 may include a plurality of pages, for example, $2^M$ number of pages ($2^M$ PAGES), where M is a positive integer. Each of the plurality of pages may include a plurality of memory cells to which a plurality of word lines may be coupled electrically. It is noted that any number of suitable blocks and pages per block may be employed.

The memory blocks may be single level cell (SLC) memory blocks and/or multi-level cell (MLC) memory blocks, according to the number of bits which may be stored in each memory cell. An SLC memory block may include a plurality of pages which are implemented with memory cells each of which is capable of storing 1-bit data. An MLC memory block may include a plurality of pages which are implemented with memory cells each of which is capable of storing multi-bit data, for example, two or more-bit data. A MLC memory block including a plurality of pages which are implemented with memory cells each of which is capable of storing 3-bit data may be employed and will be referred to as a triple level cell (TLC) memory block.

Each of the plurality of memory blocks 210 to 240 may store data provided from the host device 102 during a write operation, and may provide stored data to the host 102 during a read operation.

Figure 3:
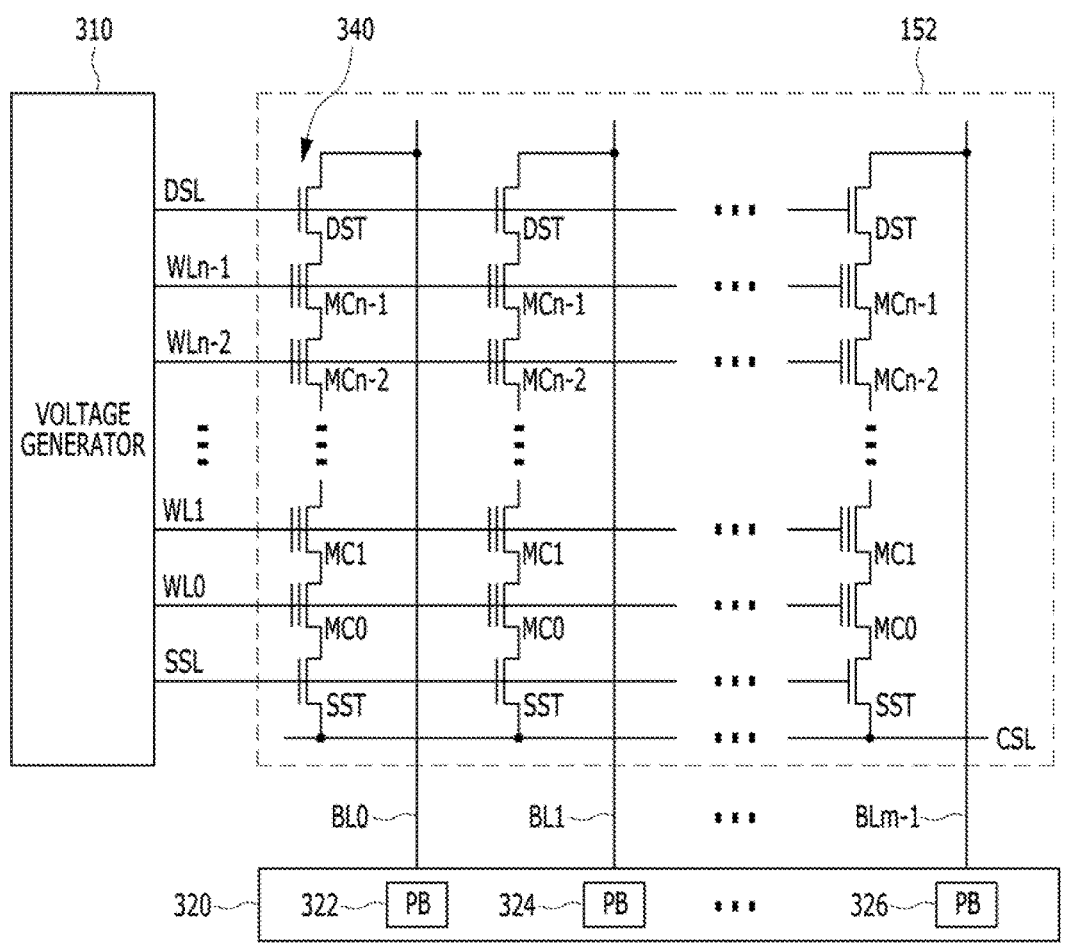
FIG. 3 is a circuit diagram illustrating a configuration example of a memory block of the memory device of FIG. 2.

Referring to FIG. 3, a memory block 152 of the memory device 150 may include a plurality of cell strings 340 coupled electrically to bit lines BL0 to BLm-1, respectively. Each cell string 340 may include at least one drain select transistor DST and at least one source select transistor SST. A plurality of memory cells or a plurality of memory cell transistors MC0 to MCn-1 may be coupled electrically in series between the select transistors DST and SST. The respective memory cells MC0 to MCn-1 may consist of multi-level cells (MLC) each of which stores data information of a plurality of bits. The memory cells may have any suitable architecture.

In FIG. 3, 'DSL' denotes a drain select line, 'SSL' denotes a source select line, and 'CSL' denotes a common source line.

FIG. 3 shows, as an example, a memory block 152 configured by NAND flash memory cells. It is to be noted, however, that the memory block 152 is not limited to NAND flash memory and may be realized, in other embodiments, by NOR flash memory, hybrid flash memory having at least two kinds of memory cells combined, or a NAND flash memory having a controller built in a memory chip. Also, the operational characteristics of a semiconductor device may be applied to not only a flash memory device in which a charge storing layer is configured by conductive floating gates but also to a charge trap flash (CTF) in which a charge storing layer is configured by a dielectric layer.

It is also noted that the memory device 150 is not limited to a flash memory device only. For example, the memory device 150 may be a DRAM or a SRAM device.

A voltage generator 310 of the memory device 150 may generate word line voltages, for example, a program voltage, a read voltage or a pass voltage, to be supplied to respective word lines according to an operation mode. The voltage generator 310 may generate voltages to be supplied to bulks, for example, well regions in which the memory cells are formed. The voltage generator 310 may perform a voltage generating operation under a control of a control circuit (not shown). The voltage generator 310 may generate a plurality of variable read voltages to generate a plurality of read data. The voltage generator 310 may select one of the memory blocks or sectors of a memory cell array, select one of the word lines of the selected memory block, and provide the word line voltages to the selected word line and unselected word lines, under the control of the control circuit.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver for driving bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to the columns (or bit lines) or pairs of the columns (or pairs of bit lines). Each of the page buffers 322, 324 and 326 may include a plurality of latches (not shown).

Figure 4:
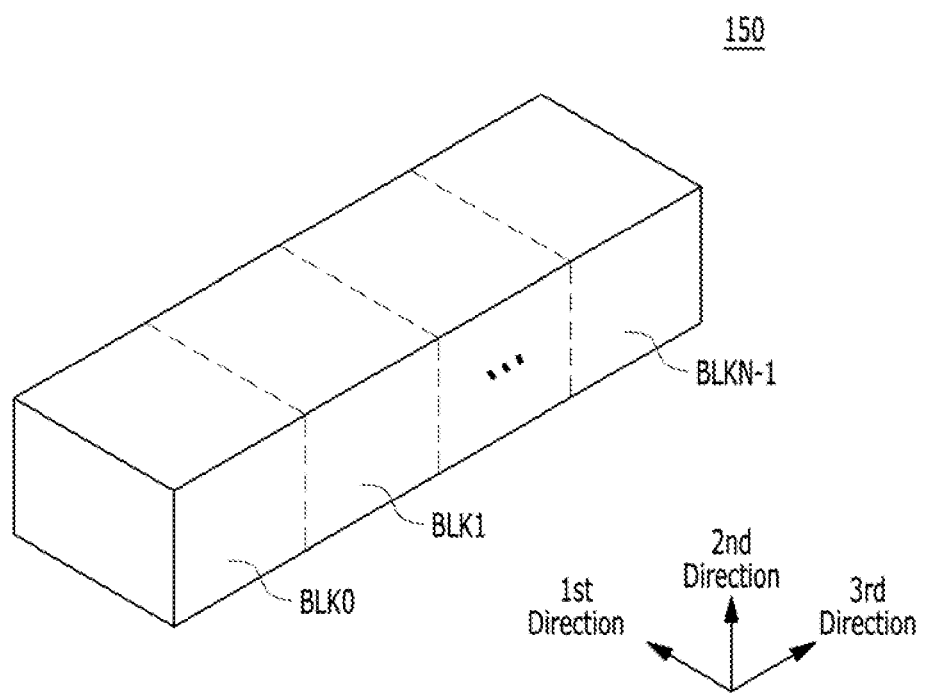
FIGS. 4 to 11 are diagrams schematically illustrating various aspects of the memory device of FIG. 2, according to various embodiments of the invention.

FIG. 4 is a block diagram illustrating an example of the plurality of memory blocks 152 to 156 of the memory device 150, according to an embodiment of the present invention.

As shown in FIG. 4, the memory device 150 may include a plurality of memory blocks BLK0 to BLKN-1. Each of the memory blocks BLK0 to BLKN-1 may be realized in a 3D structure or a vertical structure. The respective memory blocks BLK0 to BLKN-1 may include a plurality of structures extending in first to third directions, for example, an x-axis direction, a y-axis direction and a z-axis direction.

Figure 8:
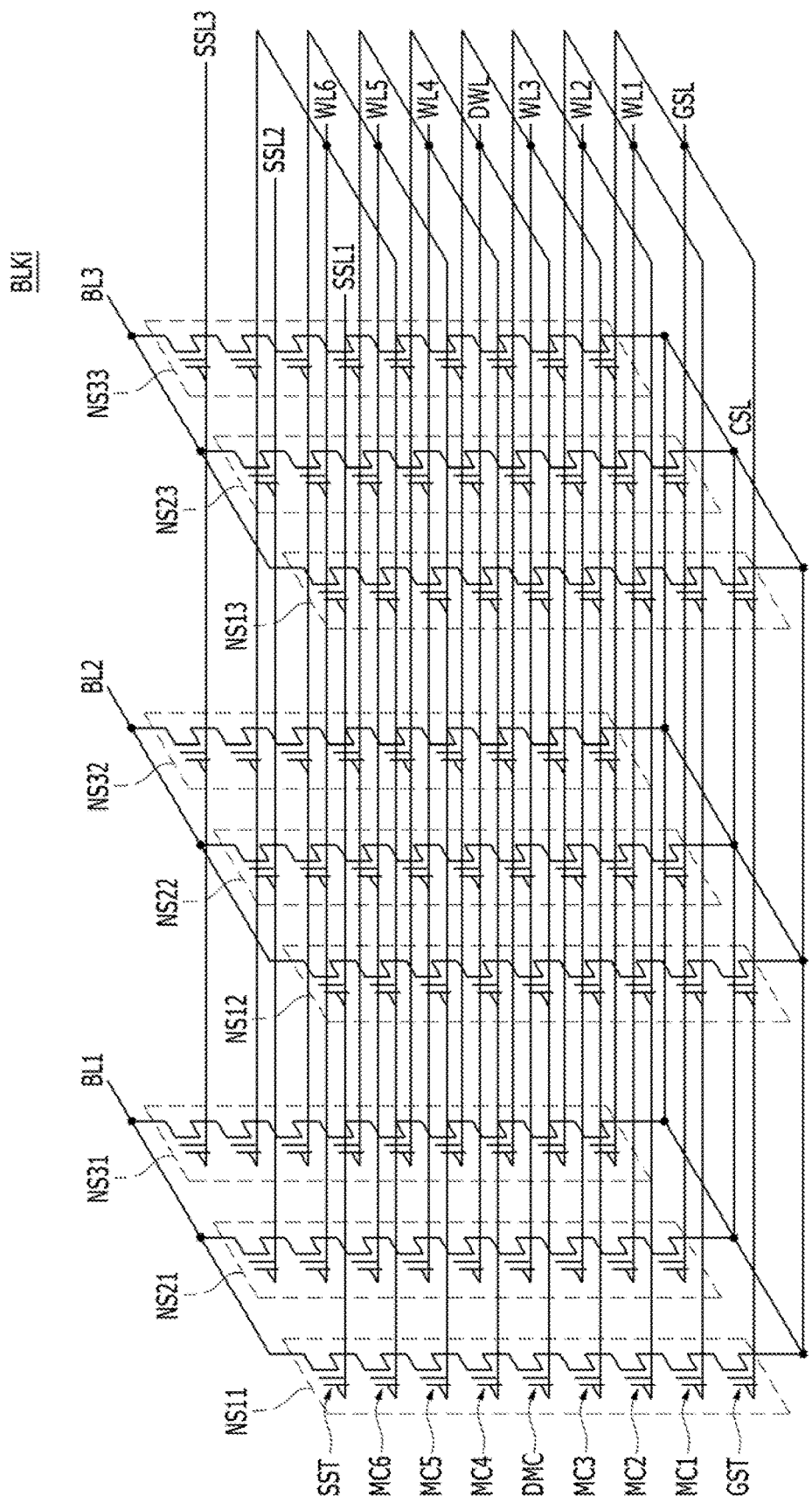

The respective memory blocks BLK0 to BLKN-1 may include a plurality of NAND strings NS extending in the second direction (FIG. 8). The plurality of NAND strings NS may be provided in the first direction and the third direction. Each NAND string NS may be coupled electrically to a bit line BL, at least one source select line SSL, at least one ground select line GSL, a plurality of word lines WL, at least one dummy word line DWL, and a common source line CSL. The respective memory blocks BLK0 to BLKN-1 may be coupled electrically to a plurality of bit lines BL, a plurality of source select lines SSL, a plurality of ground select lines GSL, a plurality of word lines WL, a plurality of dummy word lines DWL, and a plurality of common source lines CSL.

Figure 5:
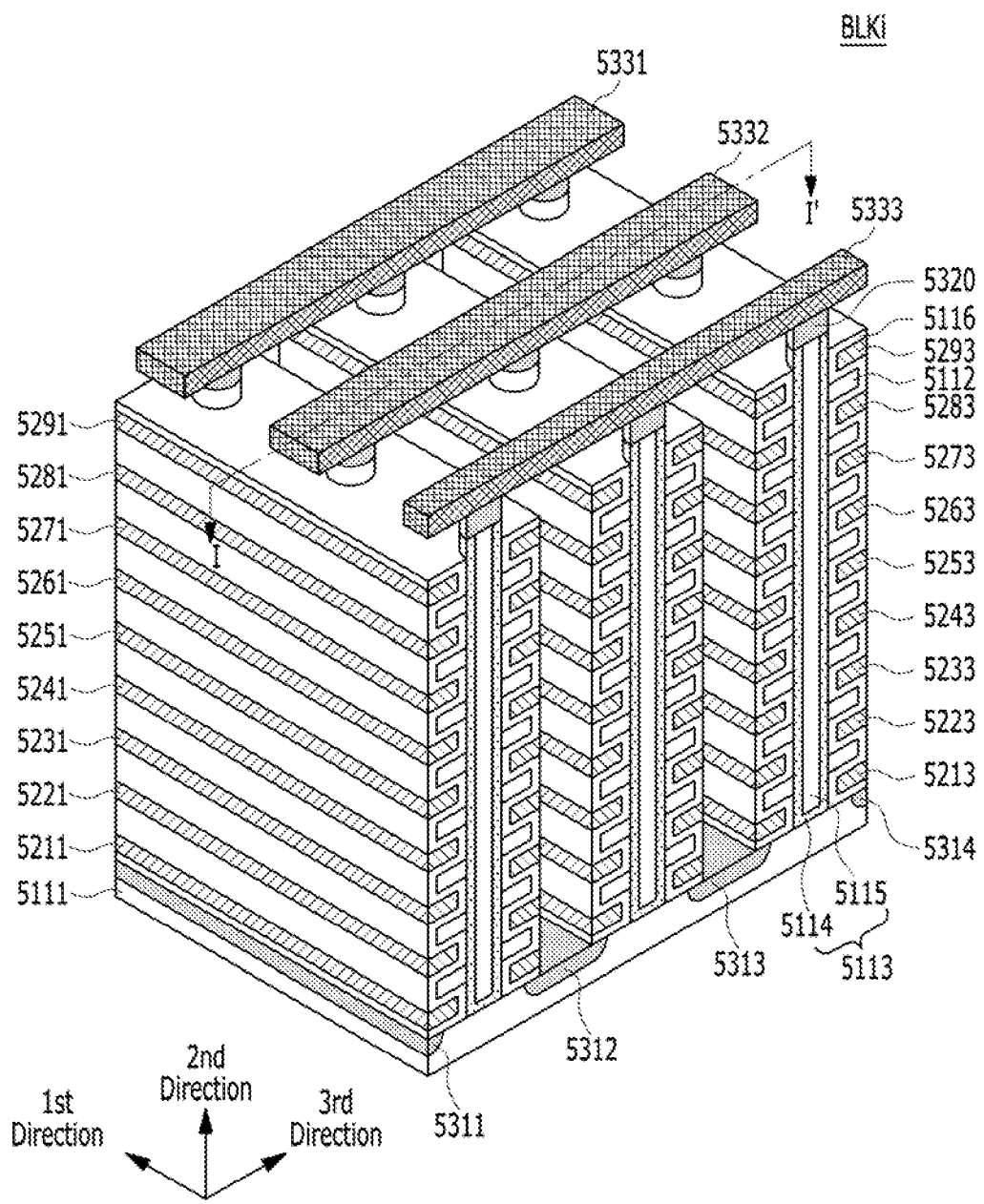
Figure 6:
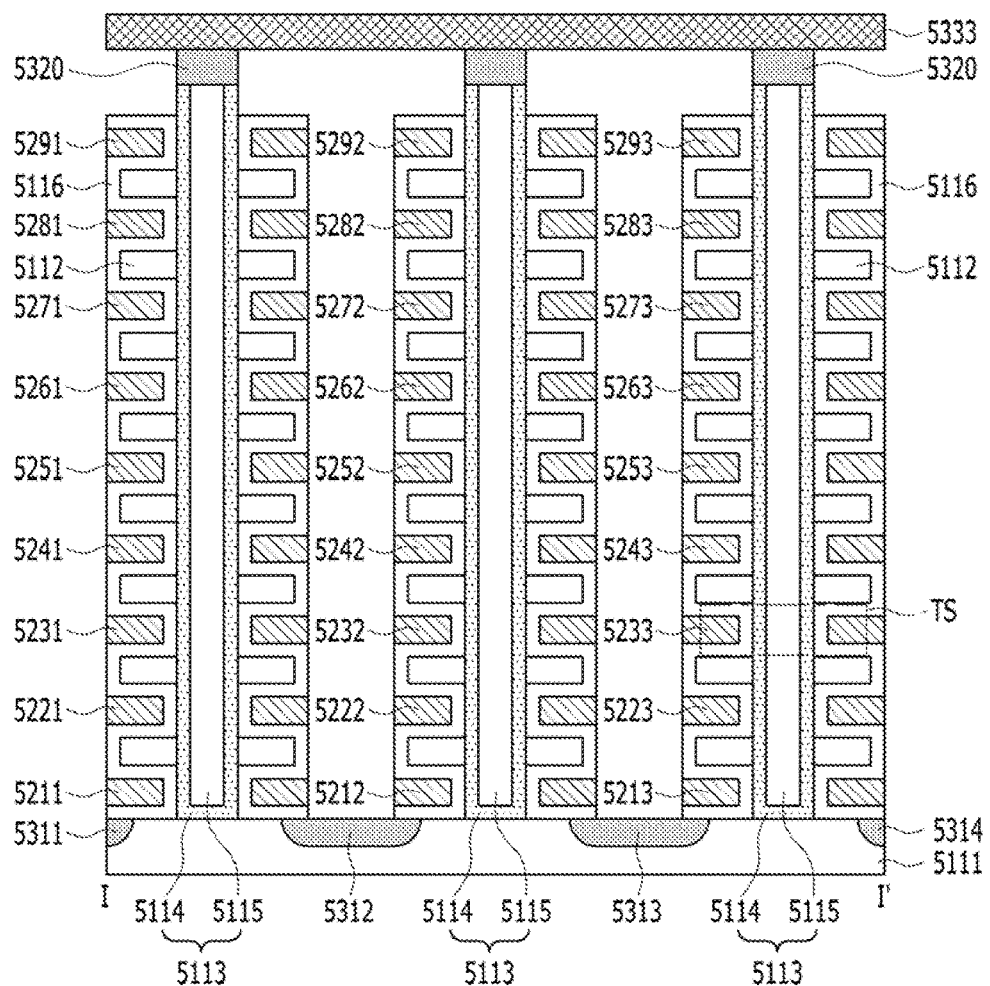

FIG. 5 is a perspective view of one memory block BLKi of the plurality memory blocks BLK0 to BLKN-1 shown in FIG. 4. FIG. 6 is a cross-sectional view taken along a line I-I' of the memory block BLKi shown in FIG. 5.

Referring to FIGS. 5 and 6, memory block BLKi may include a structure extending in the first to third directions.

The memory block may include a substrate 5111 including a silicon material doped with a first type impurity. For example, the substrate 5111 may include a silicon material doped with a p-type impurity. The substrate 5111 may be a p-type well, for example, a pocket p-well. The substrate 5111 may further include an n-type well surrounding the p-type well. Although, in the embodiment of the present invention, the substrate 5111 is exemplified as being the p-type silicon, it is to be noted that the substrate 5111 is not limited to the p-type silicon.

A plurality of doping regions 5311 to 5314 extending in the first direction may be provided over the substrate 5111. The doping regions are spaced apart at regular intervals in the third direction. The plurality of doping regions 5311 to 5314 may contain a second type impurity that is different from that of the impurity used in substrate 5111. For example, the plurality of doping regions 5311 to 5314 may be doped with an n-type impurity. Although, in the embodiment of the present invention, first to fourth doping regions 5311 to 5314 are exemplified as being the n-type, it is noted that they are not limited to the n-type.

In the region over the substrate 5111 between the first and second doping regions 5311 and 5312, a plurality of dielectric material regions 5112 extending in the first direction may be spaced apart at regular intervals in the second direction. The dielectric material regions 5112 may also be separated from the substrate 5111 by a preset distance in the second direction. Each of the dielectric material regions 5112 may be separated from one other by a preset distance in the second direction. The dielectric materials 5112 may include any suitable dielectric material, such as, silicon oxide.

In the regions over the substrate 5111 between two consecutive doping regions, for example, between doping regions 5311 and 5312, a plurality of pillars 5113 are spaced apart at regular intervals in the first direction. The plurality of pillars 5113 extend in the second direction and may pass through the dielectric material regions 5112 so that they may be coupled electrically with the substrate 5111. Each pillar 5113 may include one or more materials. For example, each pillar 5113 may include an in inner layer 5115 and an outer surface layer 5114. The surface layer 5114 may include a doped silicon material doped with an impurity. For example, the surface layer 5114 may include a silicon material doped with the same or same type impurity as the substrate 5111. Although, in the embodiment of the present invention, the surface layer 5114 is exemplified as including p-type silicon, the surface layer 5114 is not limited to the p-type silicon and other embodiments may readily envisaged by the skilled person wherein the substrate 5111 and the surface layer 5114 of the pillars 5113 may be doped with an n-type impurity.

The inner layer 5115 of each pillar 5113 may be formed of a dielectric material. The inner layer 5115 may be or include a dielectric material such as silicon oxide.

In the regions between the first and second doping regions 5311 and 5312, a dielectric layer 5116 may be provided along exposed surfaces of the dielectric material regions 5112, the pillars 5113 and the substrate 5111. A thickness of the dielectric layer 5116 may be less than one half of the distance between the dielectric material regions 5112. In other words, a region of a material other than the dielectric material 5112 and the dielectric layer 5116 may be provided between (i) the dielectric layer 5116 below the bottom surface of a first dielectric material of the dielectric material regions 5112 and (ii) the dielectric layer 5116 provided over the top surface of a second dielectric material of the dielectric material regions 5112. The dielectric material regions 5112 may lie below the first dielectric material.

In the regions between consecutive doping regions such as in the region between the first and second doping regions 5311 and 5312, a plurality of conductive material regions 5211 to 5291 may be provided over an exposed surface of the dielectric layer 5116. The plurality of the conductive material regions extending in the first direction may be spaced apart at regular intervals in the second direction in an interleaving configuration with the plurality of the dielectric material regions 5112. The dielectric layers 5116 fill the space between the conductive material regions and the dielectric material regions 5112. So for example, the conductive material region 5211 extending in the first direction may be provided between the dielectric material region 5112 adjacent to the substrate 5111 and the substrate 5111. In particular, the conductive material region 5211 extending in the first direction may be provided between (i) the dielectric layer 5116 disposed over the substrate 5111 and (ii) the dielectric layer 5116 disposed below the bottom surface of the dielectric material region 5112 adjacent to the substrate 5111.

Each of the conductive material regions 5211 to 5291 extending in the first direction may be provided between (i) a dielectric layer 5116 disposed over the top surface of one of the dielectric material regions 5112 and (ii) the dielectric layer 5116 disposed below the bottom surface of the next dielectric material region 5112. The conductive material regions 5221 to 5281 extending in the first direction may be provided between the dielectric material regions 5112. The top conductive material region 5291 extending in the first direction may be provided over the uppermost dielectric material 5112. The conductive material regions 5211 to 5291 extending in the first direction may be made of or include a metallic material. The conductive material regions 5211 to 5291 extending in the first direction may be made of or include a conductive material such as polysilicon.

In the region between the second doping region 5312 and third doping region 5313, the same structures as the structures between the first and second doping regions 5311 and 5312 may be provided. For example, in the region between the second and third doping regions 5312 and 5313, the plurality of dielectric material regions 5112 extending in the first direction, the plurality of pillars 5113 which are sequentially arranged in the first direction and pass through the plurality of dielectric material regions 5112 in the second direction, the dielectric layer 5116 which is provided over the exposed surfaces of the plurality of dielectric material regions 5112 and the plurality of pillars 5113, and the plurality of conductive material regions 5212 to 5292 extending in the first direction may be provided.

In the region between the third doping region 5313 and a fourth doping region 5314, the same structures as between the first and second doping regions 5311 and 5312 may be provided. For example, in the region between the third and fourth doping regions 5313 and 5314, the plurality of dielectric material regions 5112 extending in the first direction, the plurality of pillars 5113 which are sequentially arranged in the first direction and pass through the plurality of dielectric material regions 5112 in the second direction, the dielectric layer 5116 which is provided over the exposed surfaces of the plurality of dielectric material regions 5112 and the plurality of pillars 5113, and the plurality of conductive material regions 5213 to 5293 extending in the first direction may be provided.

Drains 5320 may be respectively provided over the plurality of pillars 5113. The drains 5320 may be made of silicon materials doped with second type impurities. The drains 5320 may be made of silicon materials doped with n-type impurities. Although for the sake of convenience of explanation, the drains 5320 are exemplified as including n-type silicon, it is noted that the drains 5320 are not limited to the n-type silicon. For example, the width of each drain 5320 may be larger than the width of each corresponding pillar 5113. Each drain 5320 may be provided in the shape of a pad over the top surface of each corresponding pillar 5113.

Conductive material regions 5331 to 5333 extending in the third direction may be provided over the drains 5320. Each of the conductive material regions 5331 to 5333 may be extendedly disposed over the drains 5320 serially arranged in the third direction with a preset separation distance to each other in the first direction. The respective conductive material regions 5331 to 5333 may be coupled electrically with the drains 5320 therebelow. The drains 5320 and the conductive material regions 5331 to 5333 extending in the third direction may be coupled electrically with through contact plugs. The conductive material regions 5331 to 5333 extending in the third direction may be made of a metallic material. The conductive material regions 5331 to 5333 extending in the third direction may be made of a conductive material such as polysilicon.

In FIGS. 5 and 6, the respective pillars 5113 may form strings together with the dielectric layer 5116 and the conductive material regions 5211 to 5291, 5212 to 5292 and 5213 to 5293 extending in the first direction. The respective pillars 5113 may form NAND strings NS together with the dielectric layer 5116 and the conductive material regions 5211 to 5291, 5212 to 5292 and 5213 to 5293 extending in the first direction. Each NAND string NS may include a plurality of transistor structures TS.

Figure 7:
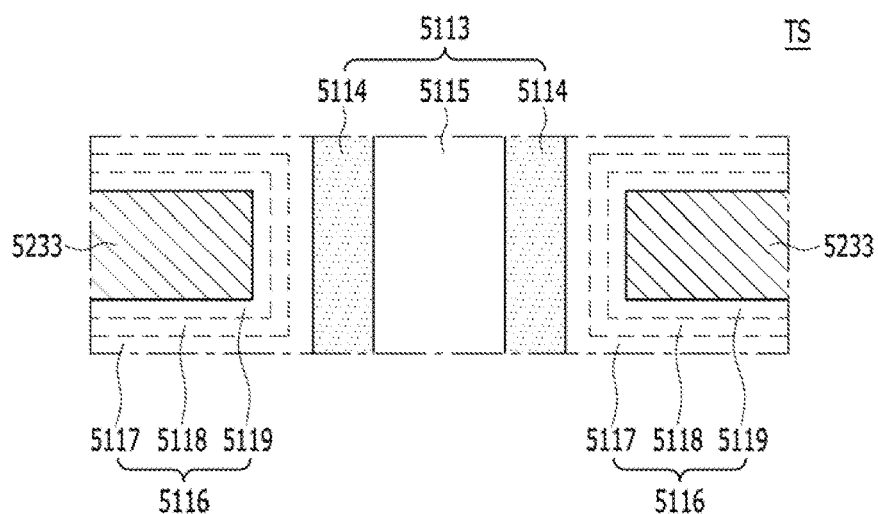

Referring now to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 extending in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. For example, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience of explanation, the surface layer 5114 of p-type silicon in each of the pillars 5113 will be referred to as a body in the second direction.

The memory block BLKi may include the plurality of pillars 5113. For example, the memory block BLKi may include the plurality of NAND strings NS. In detail, the memory block BLKi may include the plurality of NAND strings NS extending in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive material regions 5211 to 5291, 5212 to 5292 and 5213 to 5293 extending in the first direction. For example, the gates or the control gates may extend in the first direction and form word lines and at least two select lines including at least one source select line SSL and at least one ground select line GSL.

The conductive material regions 5331 to 5333 extending in the third direction may be coupled electrically to one end of the NAND strings NS. The conductive material regions 5331 to 5333 extending in the third direction may serve as bit lines BL. For example, in one memory block BLKi, the plurality of NAND strings NS may be coupled electrically to one-bit line BL.

The second type doping regions 5311 to 5314 extending in the first direction may be provided to the other ends of the NAND strings NS. The second type doping regions 5311 to 5314 extending in the first direction may serve as common source lines CSL.

For example, the memory block BLKi may include a plurality of NAND strings NS extending in a direction perpendicular to the substrate 5111, e.g., the second direction, and may serve as a NAND flash memory block, for example, of a charge capturing type memory, in which the plurality of NAND strings NS are coupled electrically to one-bit line BL.

Although it is illustrated in FIGS. 5 to 7 that the conductive material regions 5211 to 5291, 5212 to 5292 and 5213 to 5293 extending in the first direction are provided by nine (9) layers, it is noted that the conductive material regions 5211 to 5291, 5212 to 5292 and 5213 to 5293 extending in the first direction are not limited thereto. For example, conductive material regions extending in the first direction may be provided in eight (8) layers, sixteen (16) layers or any multiple layers. For example, in one NAND string NS, the number of transistors may be 8, 16 or more.

Although it is illustrated in FIGS. 5 to 7 that three (3) NAND strings NS are coupled electrically to one-bit line BL, it is noted that the embodiment is not limited thereto. In the memory block BLKi, m NAND strings NS may be coupled electrically to one-bit line BL, m being a positive integer. The number of conductive material regions 5211 to 5291, 5212 to 5292 and 5213 to 5293 extending in the first direction and the number of common source lines 5311 to 5314 may be varied with the number of NAND strings NS which are coupled electrically to one-bit line BL.

Further, although it is illustrated in FIGS. 5 to 7 that three (3) NAND strings NS are coupled electrically to one conductive material extending in the first direction, it is noted that the embodiment is not limited thereto. For example, n NAND strings NS may be coupled electrically to one conductive material extending in the first direction, n being a positive integer. The number of bit lines 5331 to 5333 may be varied with the number of NAND strings NS which are coupled electrically to one conductive material extending in the first direction.

Referring to FIG. 8, in a block BLKi having the first structure, a plurality of NAND strings NS11 to NS31 may be provided between a first bit line BL1 and a common source line CSL. The first bit line BL1 may correspond to the conductive material region 5331 of FIGS. 5 and 6, extending in the third direction. NAND strings NS12 to NS32 may be provided between a second bit line BL2 and the common source line CSL. The second bit line BL2 may correspond to the conductive material region 5332 of FIGS. 5 and 6, extending in the third direction. NAND strings NS13 to NS33 may be provided between a third bit line BL3 and the common source line CSL. The third bit line BL3 may correspond to the conductive material region 5333 of FIGS. 5 and 6, extending in the third direction.

A source select transistor SST of each NAND string NS may be coupled electrically to a corresponding bit line BL. A ground select transistor GST of each NAND string NS may be coupled electrically to the common source line CSL. Memory cells MC1 and MC6 may be provided between the source select transistor SST and the ground select transistor GST of each NAND string NS.

In this example, the NAND strings NS may be defined by units of rows and columns. The NAND strings NS which are coupled electrically to one-bit line may form one column. The NAND strings NS11 to NS31 which are coupled electrically to the first bit line BL1 may correspond to a first column. The NAND strings NS12 to NS32 which are coupled electrically to the second bit line BL2 may correspond to a second column. The NAND strings NS13 to NS33 which are coupled electrically to the third bit line BL3 may correspond to a third column. The NAND strings NS which are coupled electrically to one source select line SSL may form one row. The NAND strings NS11 to NS13 which are coupled electrically to a first source select line SSL1 may form a first row. The NAND strings NS21 to NS23 which are coupled electrically to a second source select line SSL2 may form a second row. The NAND strings NS31 to NS33 which are coupled electrically to a third source select line SSL3 may form a third row.

In each NAND string NS, a height may be defined. In each NAND string NS, the height of the memory cell MC1 adjacent to the ground select transistor GST may have, for example, a value '1'. In each NAND string NS, the height of a memory cell may increase as the memory cell gets closer to the source select transistor SST when measured from the substrate 5111. For example, in each NAND string NS, the height of a memory cell MC6 adjacent to the source select transistor SST may have, for example, a value '7'.

The source select transistors SST of the NAND strings NS arranged in the same row may share the source select line SSL. The source select transistors SST of the NAND strings NS arranged in different rows may be respectively coupled electrically to the different source select lines SSL1, SSL2 and SSL3.

The memory cells at the same height in the NAND strings NS in the same row may share a word line WL. For example, at the same height, the word lines WL coupled electrically to the memory cells MC of the NAND strings NS in different rows may be coupled electrically with each other. Dummy memory cells DMC at the same height in the NAND strings NS of the same row may share a dummy word line DWL. For example, at the same height or level, the dummy word lines DWL coupled electrically to the dummy memory cells DMC of the NAND strings NS in different rows may be coupled electrically with each other.

The word lines WL or the dummy word lines DWL located at the same level or height or layer may be coupled electrically with each other for each of the layers where the conductive material regions 5211 to 5291, 5212 to 5292 and 5213 to 5293 extending in the first direction may be provided. The conductive material regions 5211 to 5291, 5212 to 5292 and 5213 to 5293 extending in the first direction may be coupled electrically in common to upper layers through contacts. In other words, the ground select transistors GST of the NAND strings NS in the same row may share the ground select line GSL. Further, the ground select transistors GST of the NAND strings NS in different rows may share the ground select line GSL. For example, the NAND strings NS11 to NS13, NS21 to NS23 and NS31 to NS33 may be coupled electrically in common to the ground select line GSL.

The common source line CSL may be coupled electrically in common to the NAND strings NS. Over the active regions over the substrate 5111, the first to fourth doping regions 5311 to 5314 may be coupled electrically. The first to fourth doping regions 5311 to 5314 may be coupled electrically in common to an upper layer through contacts.

For example, as shown in FIG. 8, the word lines WL of the same height or level may be coupled electrically to each other. Accordingly, when a word line WL at a certain height is selected, all NAND strings NS which are coupled electrically to the selected word line WL may be selected. The NAND strings NS in different rows may be coupled electrically to different source select lines SSL. Accordingly, among the NAND strings NS coupled electrically to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, the NAND strings NS arranged in the same row as the selected source line may be selected. Furthermore, by selecting one of the bit lines BL1 to BL3, the NAND strings NS arranged in the same column as the selected bit line may be selected. Accordingly, only the NAND strings NS arranged in the same row as the selected source line and the same column as the selected bit line may be selected.

In each NAND string NS, a dummy memory cell DMC may be provided. In FIG. 8, for example, the dummy memory cell DMC may be provided between a third memory cell MC3 and a fourth memory cell MC4 in each NAND string NS. For example, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into two (2) memory cell groups by the dummy memory cell DMC. In the divided memory cell groups, memory cells, for example, MC1 to MC3, adjacent to the ground select transistor GST may be referred to as a lower memory cell group, and remaining memory cells, for example, MC4 to MC6, adjacent to the string select transistor SST may be referred to as an upper memory cell group.

Herein below, detailed descriptions will be made with reference to FIGS. 9 to 11, which show a memory device in a memory system, according to an embodiment implemented with a three-dimensional (3D) nonvolatile memory device different from the first structure.

Figure 9:
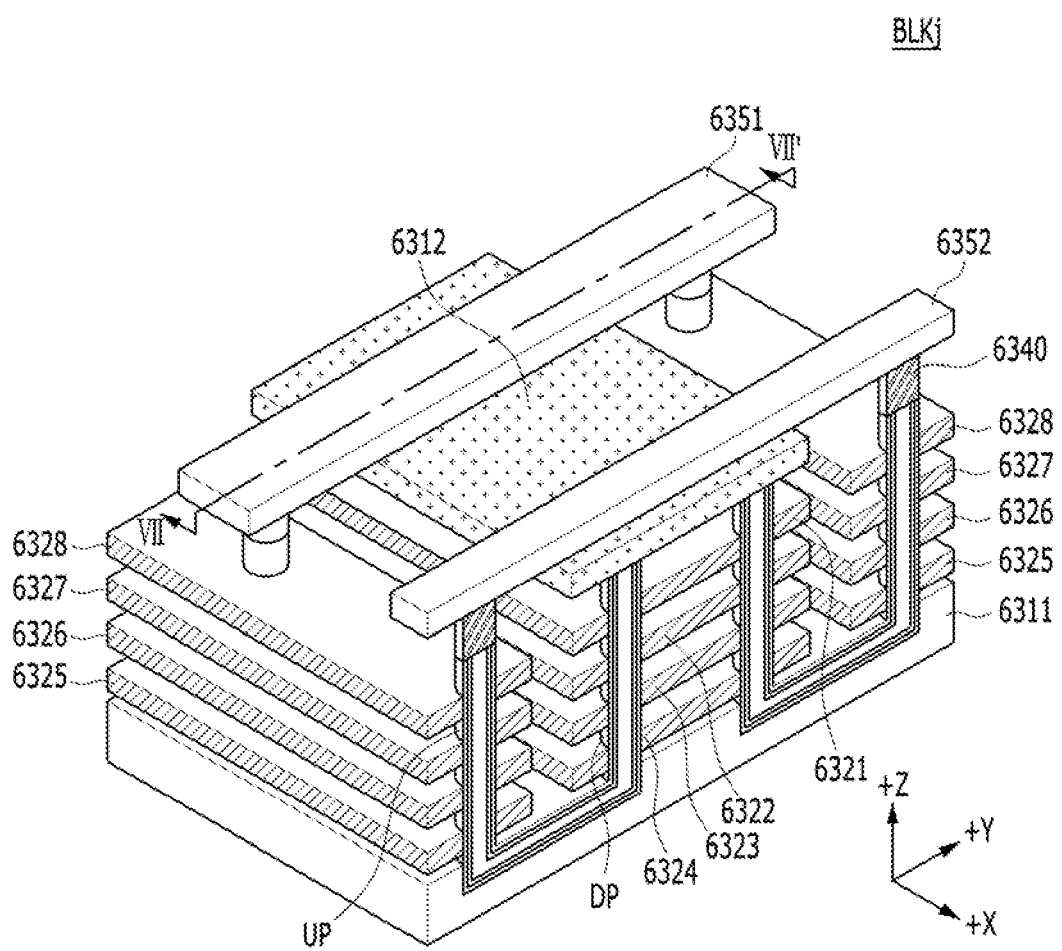

FIG. 9 is a perspective view schematically illustrating a memory device implemented with a three-dimensional (3D) nonvolatile memory device, which is different from the first structure described above with reference to FIGS. 5 to 8 and showing a memory block BLKj of the plurality of memory blocks of FIG. 4. FIG. 10 is a cross-sectional view illustrating the memory block BLKj taken along the line VII-VII' of FIG. 9.

Figure 10:
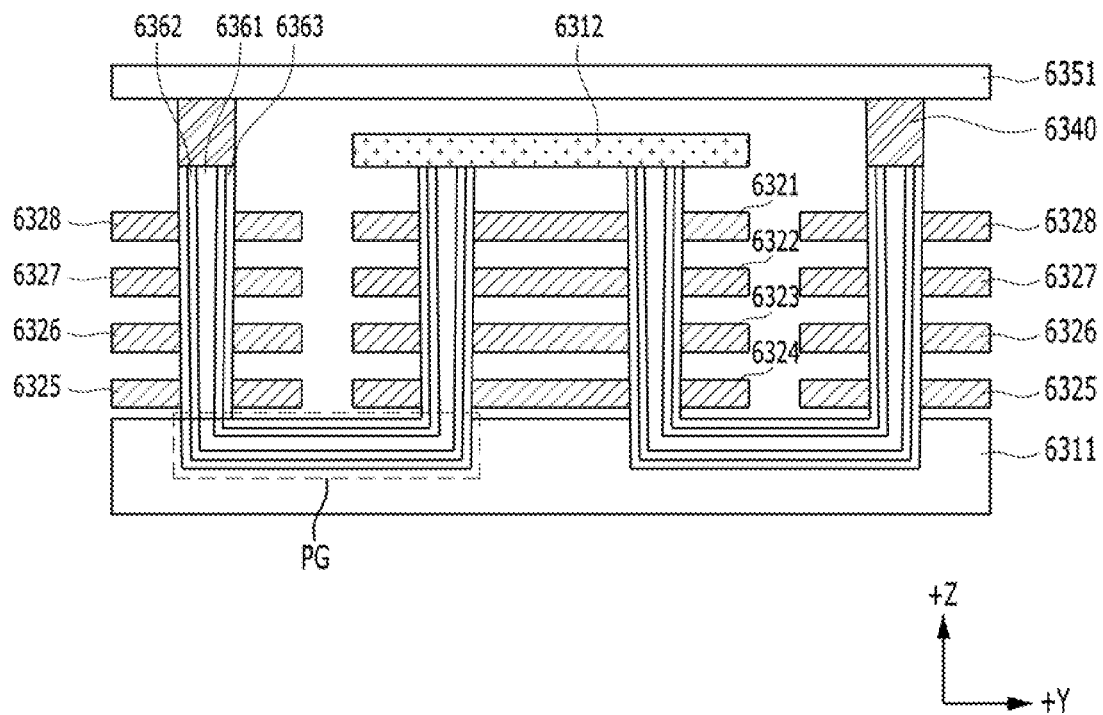

Referring to FIGS. 9 and 10, the memory block BLKj may include structures extending in the first to third directions and may include a substrate 6311. The substrate 6311 may include a silicon material doped with a first type impurity. For example, the substrate 6311 may include a silicon material doped with a p-type impurity. The substrate 6311 may be a p-type well, for example, a pocket p-well. The substrate 6311 may further include an n-type well which surrounds the p-type well. Although, in the described embodiment, the substrate 6311 is exemplified as being the p-type silicon, it is noted that the substrate 6311 is not limited to the p-type silicon.

First to fourth conductive material regions 6321 to 6324 extending in an x-axis direction and a y-axis direction are provided over the substrate 6311. The first to fourth conductive material regions 6321 to 6324 may be separated by a preset distance in the z-axis direction.

Fifth to eighth conductive material regions 6325 to 6328 extending in the x-axis direction and the y-axis direction may be provided over the substrate 6311. The fifth to eighth conductive material regions 6325 to 6328 may be separated by the preset distance in the z-axis direction. The fifth to eighth conductive material regions 6325 to 6328 may be separated from the first to fourth conductive material regions 6321 to 6324 in the y-axis direction.

A plurality of lower pillars DP passing through the first to fourth conductive material regions 6321 to 6324 may be provided. Each lower pillar DP may extend in the z-axis direction. Also, a plurality of upper pillars UP passing through the fifth to eighth conductive material regions 6325 to 6328 may be provided. Each upper pillar UP may extend in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower and the upper pillars DP and UP may be coupled electrically with each other through a pipe gate PG. The pipe gate PG may be disposed in the substrate 6311. For example, the pipe gate PG may include the same material as the lower pillar DP and the upper pillar UP.

A doping material 6312 of a second type extending in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive material regions 6351 and 6352 extending in the y-axis direction may be provided over the drains 6340.

The first and second upper conductive material regions 6351 and 6352 may be spaced apart along the x-axis direction. The first and second upper conductive material regions 6351 and 6352 may be formed of a metal. The first and second upper conductive material regions 6351 and 6352 and the drains 6340 may be coupled electrically with each other through contact plugs. The first and second upper conductive material regions 6351 and 6352 may serve as first and second bit lines BL1 and BL2, respectively.

The first conductive material 6321 may serve as a source select line SSL. The second conductive material 6322 may serve as a first dummy word line DWL1. The third and fourth conductive material regions 6323 and 6324 may serve as first and second main word lines MWL1 and MWL2, respectively. The fifth and sixth conductive material regions 6325 and 6326 may serve as third and fourth main word lines MWL3 and MWL4, respectively. The seventh conductive material 6327 may serve as a second dummy word line DWL2. The eighth conductive material 6328 may serve as a drain select line DSL.

The lower pillar DP and the first to fourth conductive material regions 6321 to 6324 adjacent to the lower pillar DP may form a lower string. The upper pillar UP and the fifth to eighth conductive material regions 6325 to 6328 adjacent to the upper pillar UP may form an upper string. The lower string and the upper string may be coupled electrically with each other through the pipe gate PG. One end of the lower string may be coupled electrically to the doping material 6312 of the second type which serves as the common source line CSL. One end of the upper string may be coupled electrically to a corresponding bit line through the drain 6340. One lower string and one upper string may form one cell string which is coupled electrically between the doping material 6312 serving as the common source line CSL and a corresponding one of the upper conductive material layers 6351 and 6352 serving as the bit line BL.

For example, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS. The NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
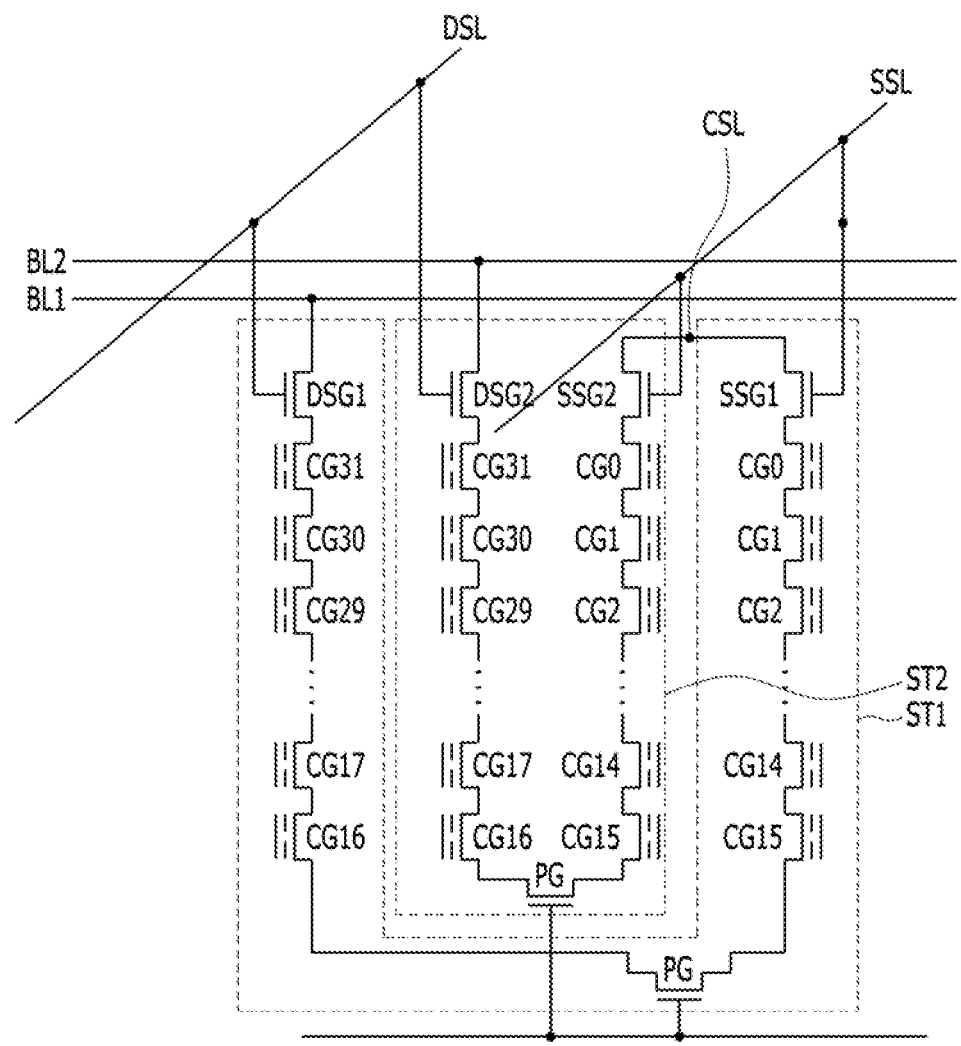

FIG. 11 is a circuit diagram illustrating the equivalent circuit of the memory block BLKj having the second structure as described above with reference to FIGS. 9 and 10. For the sake of convenience, only a first string ST1 and a second string ST2 are shown, forming a pair in the memory block BLKj in the second structure.

Referring to FIG. 11, in the memory block BLKj having the second structure, a plurality of cell strings, each of which is implemented with one upper string and one lower string coupled electrically through the pipe gate PG as described above with reference to FIGS. 9 and 10, may be provided, in such a way as to define a plurality of pairs.

For example, in memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first and the second strings ST1 and ST2 may be coupled electrically to the same drain select line DSL and the same source select line SSL. The first string ST1 may be coupled electrically to a first bit line BL1. The second string ST2 may be coupled electrically to a second bit line BL2.

Although FIG. 11 shows the first string ST1 and the second string ST2 are coupled electrically to the same drain select line DSL and the same source select line SSL, it may be envisaged that the first string ST1 and the second string ST2 may be coupled electrically to the same source select line SSL and the same bit line BL, the first string ST1 may be coupled electrically to a first drain select line DSL1 and the second string ST2 may be coupled electrically to a second drain select line DSL2. Further it may be envisaged that the first string ST1 and the second string ST2 may be coupled electrically to the same drain select line DSL and the same bit line BL, the first string ST1 may be coupled electrically to a first source select line SSL1 and the second string ST2 may be coupled electrically a second source select line SSL2.

Figure 12:
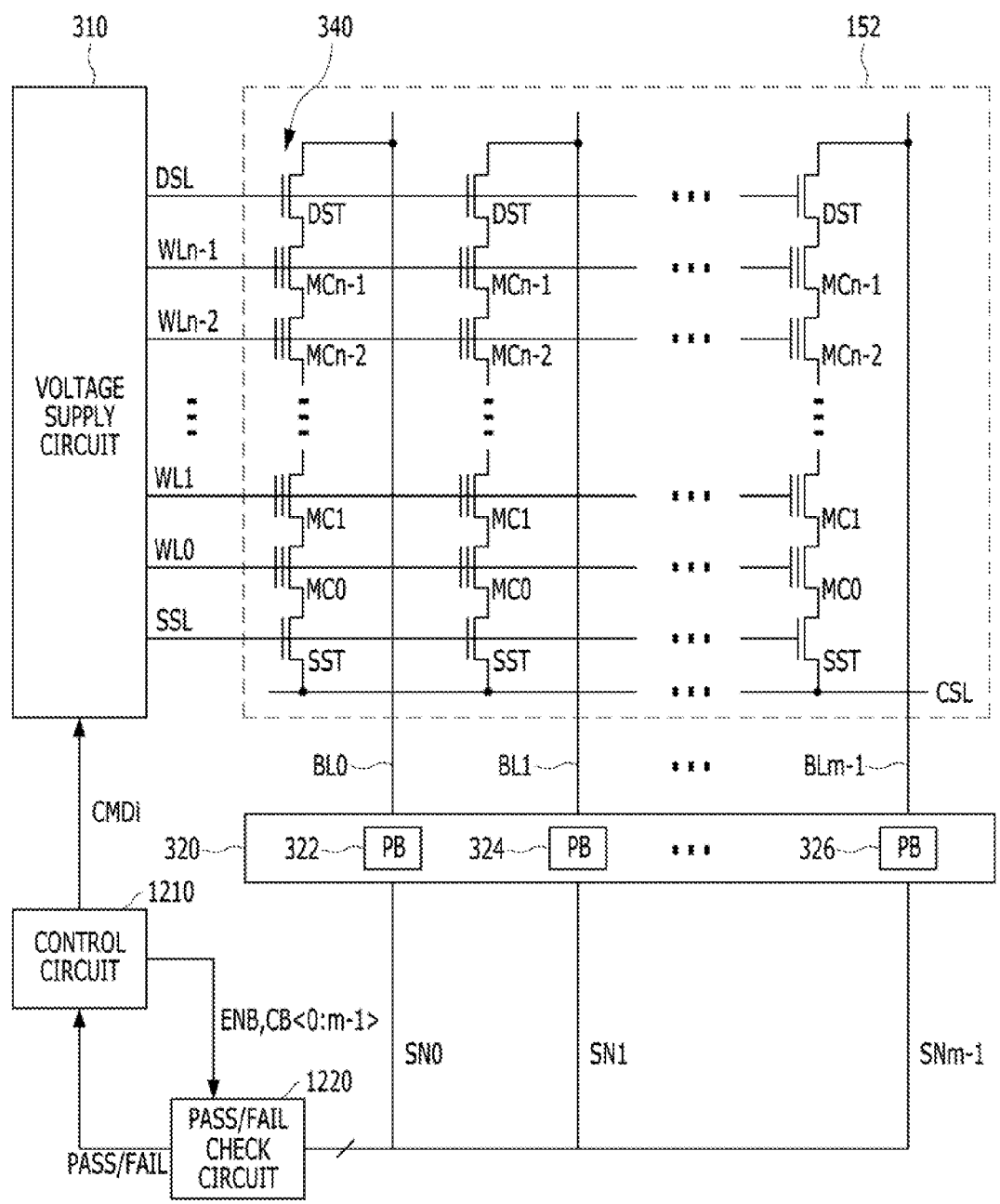
FIG. 12 is a diagram illustrating a configuration of a memory device, according to an embodiment of the present invention.

FIG. 12 is a diagram illustrating a configuration of a memory device according to an embodiment of the present invention.

It may be seen that the memory device of FIG. 12 is shown with reference to the configuration of the memory device 150 of FIG. 3. That is, in accordance with an embodiment of the present invention the memory device 150 may further include a control circuit 1210 and a pass/fail check circuit 1220.

The memory device 150 in accordance with an embodiment of the present invention may apply a program pulse to the word lines WL of memory cells MC when performing a program operation. The memory device 150 may then perform a program verification operation for checking whether the program operation for the memory cells MC has been completed using page buffers PB coupled to the memory cells MC. Furthermore, the memory device 150 may perform a pass/fail check operation for determining whether fail bits are generated to the extent that error correction code (ECC) is possible by counting fail memory cells checked through the program verification operation. If, as a result of the determination, the number of fail bits generated is smaller than the number of ECC-permitted bits, the program operation is treated as being a pass. If, as a result of the determination, the number of fail bits generated is equal to or greater than the number of ECC-permitted bits, the program operation is treated as being a fail.

The plurality of page buffers PB 322, 324, . . . , 326 of a read/write circuit 320 may be coupled to memory cells (e.g., MC0) through respective bit lines BL0 to BLm−1, and may perform a program verification operation. The page buffers PB store verification data depending on the program states of the memory cells MC0 and maintain the potentials of sense nodes SN0 to SNm−1 to a high level or change the potential of the sense nodes to a low level based on the stored verification data. For example, if the program states of the memory cells MC0 are determined to be a pass, the verification data of "1" are stored, and the sense nodes SN0 to SNm−1 switch to a low level. If the program states of the memory cells MC0 are determined to be a fail, the verification data of "0" are stored, and the sense nodes SN0 to SNm−1 maintain a high level. An operation of the page buffer PB when a program verification operation is performed is described in detail with reference to the following drawings.

The pass/fail check circuit 1220 may compare the amount of a first current flowing into a current path which is generated depending on a voltage level of the sense nodes SN of the page buffers PB of the read/write circuit 320 with the amount of a second current corresponding to the number of permissible bits which may be processed by an error correction code (ECC) circuit (not shown) and output a pass/fail signal PASS/FAIL based on the comparison. For example, if the measured amount of the first current flowing into the current path is higher than the reference amount of the second current corresponding to the number of permissible bits, the pass/fail check circuit 1220 outputs the fail signal FAIL. If the measured amount of the first current is equal to or smaller than the reference amount of the second current, the pass/fail check circuit 1220 outputs the pass signal PASS. A more detailed configuration and operation of the pass/fail check circuit 1220 are described in detail with reference to the following drawings.

The control circuit 1210 may determine a program operation to be a pass or fail in response to the pass or fail signal PASS or FAIL outputted by the pass/fail check circuit 1220 and checks whether a corresponding memory block is a fail. The memory device 150, in accordance with an embodiment of the present invention, may perform a program operation using an incremental step pulse program (ISPP) method for raising and applying a program voltage, that is, a pulse signal increasing one step at a time. In this case, the control circuit 1210 may skip an operation for determining a program operation to be a pass or fail while applying the initially set number of program pulses, thus improving the operating speed of the memory system.

After applying an initially set number of program pulses, the control circuit 1210 may determine a program operation for a corresponding page in response to the pass or fail signal PASS or FAIL. In response to the pass signal PASS outputted by the pass/fail check circuit 1220, the control circuit 1210 may determine the program operation for the corresponding page to be a pass and terminate the program operation. Furthermore, when the pass/fail check circuit 1220 outputs the fail signal FAIL, the control circuit 1210 may generate an internal command CMDi and control a voltage supply circuit 310 so that the voltage supply circuit 310 may raise a program pulse by a step voltage and apply the raised program pulse to a word line WL again.

The control circuit 1210 may repeatedly control the voltage supply circuit 310 in response to the fail signal FAIL so that the voltage supply circuit 310 may raise a program pulse and apply the raised program pulse to the word line WL until the number of applications of the program pulses reaches a maximum number. The maximum number of applications of the program pulses may be a preset maximum number. Hence, if the pass/fail check circuit 1220 generates the fail signal FAIL even after the preset maximum number of program pulses has been applied, the control circuit 1210 may determine a corresponding memory page to be a program fail and terminate the program operation. The corresponding memory page may be determined to be a "fail" page. Subsequent program and read operations may then be prevented from being performed on such a fail-page. Reference may be made to such a fail-page when checking whether a corresponding memory block including the page is a fail-memory block.

Furthermore, the control circuit 1210 may check the number of permissible bits which may be processed by the ECC circuit (not shown) and generate a verification signal CB<0:m−1> based on the checked number of permissible bits. The control circuit 1210 may determine the bit values of the verification signal CB<0:m−1> based on the number of permissible bits. The control circuit 1210 in accordance with an embodiment of the present invention may change the bit values of the verification signal CB<0:m−1> in response to the pass signal PASS outputted by the pass/fail check circuit 1220 and output the verification signal CB<0:m−1> having the changed bit values. Such an operation is described in detail with reference to the operation of the pass/fail check circuit 1220 of FIG. 14.

Figure 13:
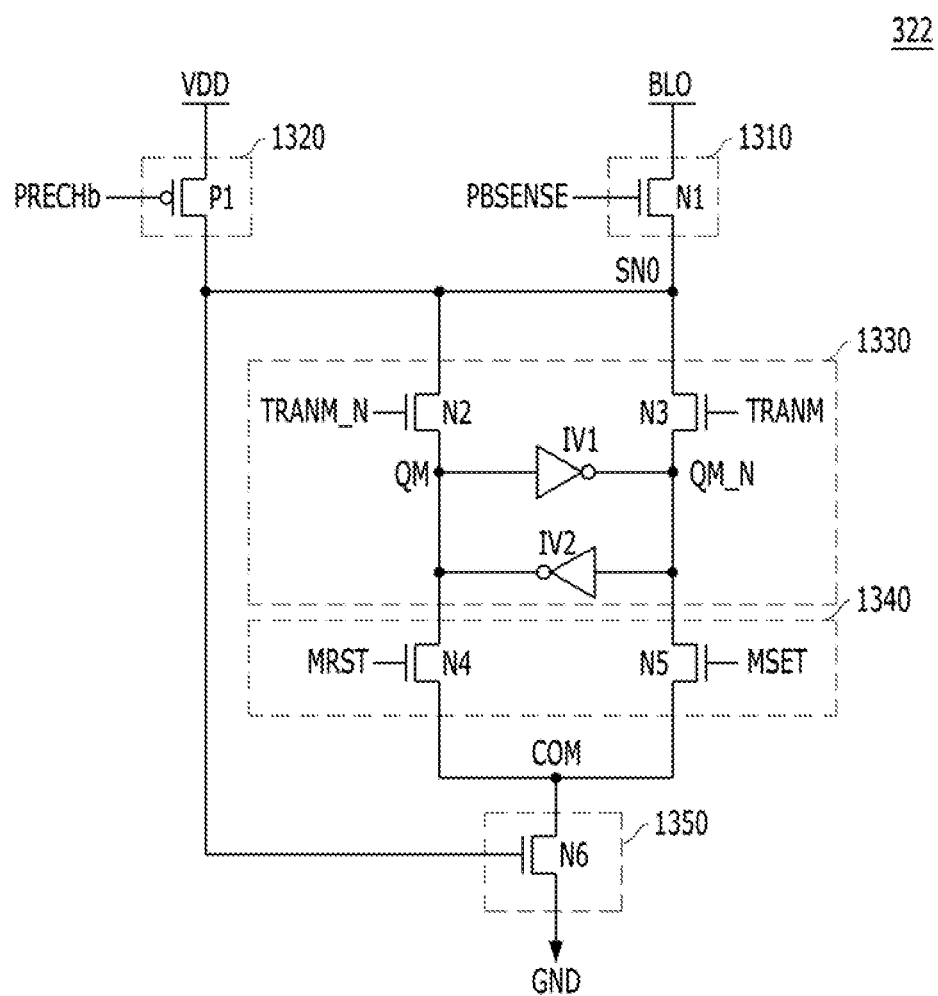
FIG. 13 is a circuit diagram of an example of a page buffer included in the read/write circuit of FIG. 12, according to an embodiment of the invention.

FIG. 13 is a circuit diagram showing an example of a page buffer PB included in the read/write circuit 320 of FIG. 12. The first page buffer 322 of the plurality of page buffers PB 322, 324, . . . , 326 has been illustrated as a representative example.

Referring to FIG. 13, the first page buffer 322 may include a bit line connection unit 1310, a precharge unit 1320, a latch unit 1330, a data input unit 1340, and a sensing unit 1350.

The bit line connection unit 1310 may be coupled between the bit line BL0 and the sense node SN0 and may couple the bit line BL0 and the sense node SN0 in response to a connection signal PBSENSE. The bit line connection unit 1310 may include a first NMOS transistor N1.

The precharge unit 1320 may be coupled between a power supply voltage terminal VDD and the sense node SN0, and may precharge the sense node SN0 to a power supply voltage level in response to a precharge signal PRECHb. The precharge unit 1320 may include a first PMOS transistor P1.

The latch unit 1330 may be coupled to the sense node SN0, and may change the potential of the sense node SN0 to a high level or a low level in response to latched data. The latch unit 1330 may include inverters IV1 and IV2 coupled in parallel between a first node QM and a second node QM_N in opposite directions, a second NMOS transistor N2 coupled between the first node QM and the sense node SN0, and a third NMOS transistor N3 coupled between the second node QM_N and the sense node SN0. The second NMOS transistor N2 may be turned on in response to a first transmission signal TRANM_N. The third NMOS transistor N3 may be turned on in response to a second transmission signal TRANM.

The data input unit 1340 may be coupled between a common node COM and the first node QM and second node QM_N of the latch unit 1330, and input data, determined by the potential of the common node COM, to the latch unit 1330 in response to first and second input signals MRST and MSET. The data input unit 1340 may include fourth and fifth NMOS transistors N4 and N5. The fourth NMOS transistor N4 may be coupled between the first node QM and the common node COM and may be turned on in response to the first input signal MRST. The fifth NMOS transistor N5 may be coupled between the second node QM_N and the common node COM and may be turned on in response to the second input signal MSET.

The sensing unit 1350 may be coupled between the common node COM and a ground voltage terminal GND. The sensing unit 1350 may be turned on or off in response to the potential of the sense node SN0, thus controlling the potential of the common node COM. The sensing unit 1350 may include a sixth NMOS transistor N6.

An operation for storing verification data when the program verification operation of the page buffer 322 is performed is described below.

The page buffer 322 verifies the program state of a memory cell (e.g., MC0) coupled thereto through a corresponding bit line BL0. The program verification operation may be performed like a read operation. First, the page buffer 322 may precharge the bit line BL0 to a high voltage level and then may apply a verification voltage to the word line WL0 coupled to the memory cell MC0. Accordingly, the potential of the bit line BL0 may maintain a high level or may be discharged to a low level depending on the program state of the memory cell MC0. At this time, program data programmed into the memory cell MC0 have been stored in the latch unit 1330 of the page buffer 322. The page buffer 322 may compare the program data with the potential of the bit line BL0 and store corresponding verification data in the latch unit 1330. If, as a result of the comparison, the program data and the potential of the bit line BL0 correspond to each other, a corresponding program operation is determined to be a pass, i.e., successfully completed. Hence, in this case, the verification data may indicate that the potential of the second node QM_N becomes "1", that is, a high level. If, as a result of the comparison, the program data and the potential of the bit line BL0 do not correspond to each other and thus the corresponding program operation is determined to be a fail, i.e., not successfully completed, the verification data may indicate that the potential of the second node QM_N becomes "0", that is, a low level. Thereafter, the page buffer 322 may precharge the sense node SN0 to a high voltage level by using the precharge unit 1320 and may couple the first node QM and the sense node SN0 in response to the first transmission signal TRANM_N of a high level. Accordingly, the potential of the sense node SN0 may be controlled in response to the value of the verification data which are latched in the latch unit 1330. That is, if the memory cell MC0 is determined to be a pass cell, i.e., a cell for which the program operation was successfully completed, the sense node SN0 of the page buffer 322 may be discharged to a low voltage level. If the memory cell MC0 is determined to be a program fail cell, i.e. a cell for which the program operation was not successfully completed, the sense node SN0 of the page buffer 322 may maintain a high voltage level.

Figure 14:
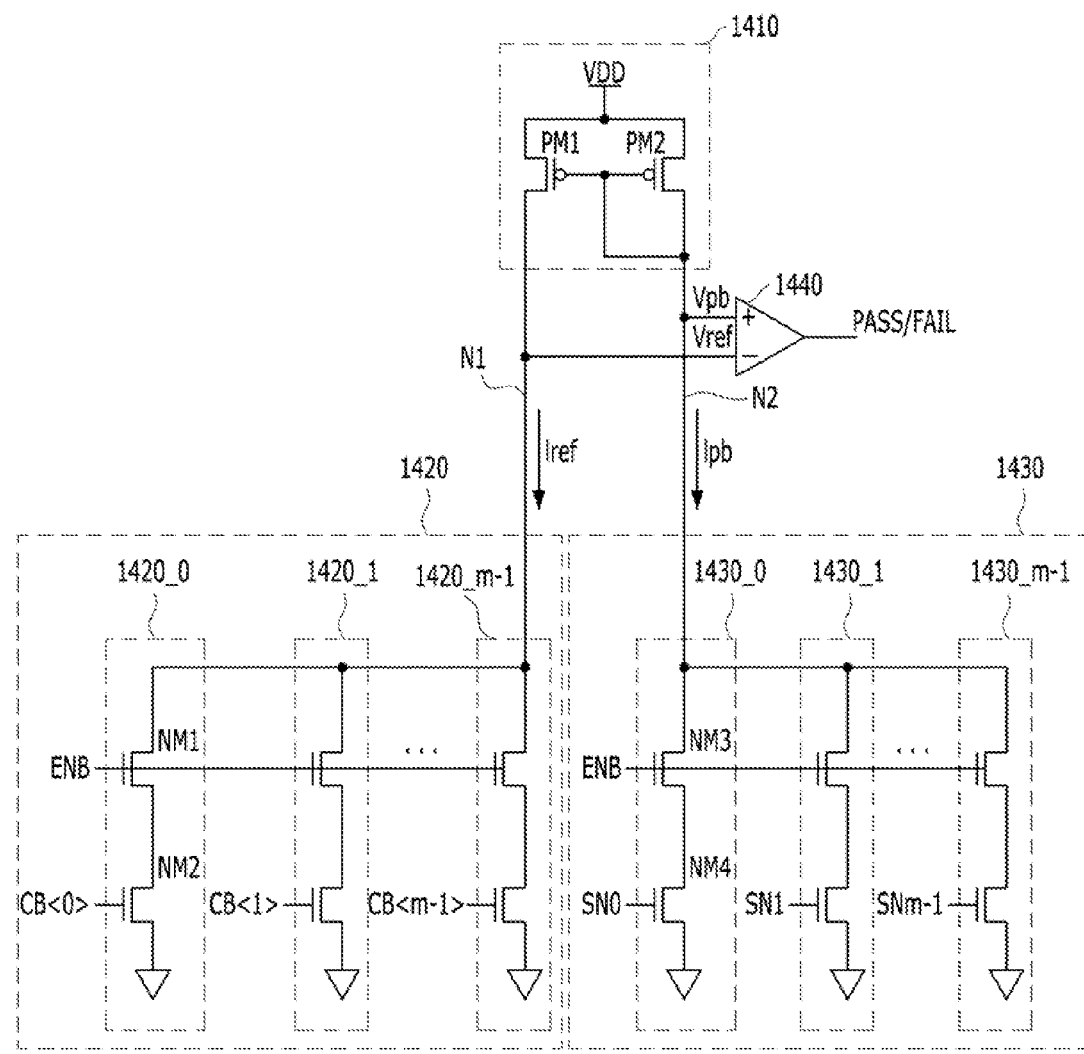
FIG. 14 is a circuit diagram of an example of a pass/fail check circuit of FIG. 12, according to an embodiment of the invention.

FIG. 14 is a circuit diagram showing an example of the pass/fail check circuit 1220 of FIG. 12, according to an embodiment of the invention.

Referring to FIG. 14, the pass/fail check circuit 1220 may include a current supply unit 1410, a reference current generation unit 1420, a sensing current generation unit 1430, and a comparison unit 1440.

The current supply unit 1410 may include first and second PMOS transistors PM1 and PM2. The first PMOS transistor PM1 may be coupled between the power supply voltage terminal VDD and a first node N1. The second PMOS transistor PM2 may be coupled between the power supply voltage terminal VDD and a second node N2. The gates of the first and the second PMOS transistors PM1 and PM2 may be coupled to the second node N2.

The reference current generation unit 1420 may be coupled between the first node N1 of the current supply unit 1410 and the ground voltage terminal GND. The reference current generation unit 1420 may include a plurality of first current distribution units 1420_0 to 1420_*m*-1 coupled in parallel between the first node N1 and the ground voltage terminal GND, corresponding to the plurality of bit values CB<0> to CB<m-1> of the verification signal CB<0:m-1>. Each of the first current distribution units 1420_0 to 1420_*m*-1 may include two NMOS transistors coupled in series between the first node N1 and the ground voltage terminal GND.

For example, the first current distribution unit 1420_0 may include first and second NMOS transistors NM1 and NM2 coupled in series between the first node N1 and the ground voltage terminal GND. The first NMOS transistor NM1 may be turned on in response to an enable signal ENB. The second NMOS transistor NM2 may be turned on in response to a corresponding bit value, that is, the first bit value CB<0> of the verification signal CB<0:m-1>.

As described above, the plurality of bit values of the verification signal CB<0:m-1> may be determined based on the number of permissible bits which may be processed by the ECC circuit (not shown). For example, if the number of permissible bits which may be processed by the ECC circuit is "a" (a<m), the plurality of bit values may include "a" bit values of a high level "1" and "m-a" bit values of a low level "0." In this case, the current distribution units 1420_0 to 1420_*m*-1 may form "a" current paths from the first node N1 to the ground voltage terminal GND in response to the "a" bit values of a high level.

The sensing current generation unit 1430 may be coupled between the second node N2 of the current supply unit 1410 and the ground voltage terminal GND. The sensing current generation unit 1430 may include a plurality of second current distribution units 1430_0 to 1430_*m*-1 coupled in parallel between the second node N2 and the ground voltage terminal GND, corresponding to the plurality of page buffers PB. Each of the second current distribution units 1430_0 to 1430_*m*-1 may include two NMOS transistors coupled in series between the second node N2 and the ground voltage terminal GND.

For example, the second current distribution unit 1430_0 includes third and fourth NMOS transistors NM3 and NM4 coupled in series between the second node N2 and the ground voltage terminal GND. The third NMOS transistor NM3 may be turned on in response to the enable signal ENB. The fourth NMOS transistor NM4 may be turned on in response to the potential of the verification node SN0 of a corresponding page buffer, that is, the first page buffer 322. That is, each of the second current distribution units 1430_0 to 1430_m−1 may form a current path from the second node N2 to the ground voltage terminal GND in response to the potential of the sense node SN of a corresponding page buffer PB.

The comparison unit 1440 may compare a reference current Iref flowing through the reference current generation unit 1420 with a sensing current Ipb flowing through the sensing current generation unit 1430 and generate the pass or fail signal PASS or FAIL. For example, if the reference current Iref is higher than the sensing current Ipb, the comparison unit 1440 may generate the pass signal PASS of a high level because the reference potential Vref of the first node N1 is lower than the sensing potential Vpd of the second node N2. If the reference current Iref is lower than the sensing current Ipb, the comparison unit 1440 may generate the fail signal FAIL of a low level because the reference potential Vref of the first node N1 is higher than the sensing potential Vpd of the second node N2.

That is, in accordance with an embodiment of the present invention, the page buffer PB may verify the program state of the memory cell MC and maintain the sense node SN to a high level if, as a result of the verification, the memory cell MC is determined to be a program fail. Accordingly, as many sense nodes SN may be maintained to a high level as the memory cells MC that are determined to be a program fail, and the corresponding second current distribution units 1430_0 to 1430_m−1 may be turned on, thus forming a current path. In contrast, in the reference current generation unit 1420, the verification signal CB<0:m−1> may have as many bit values of a high level as the permissible bits, and the corresponding first current distribution units 1420_0 to 1420_m−1 may be turned on, thus forming a current path.

Accordingly, if the number of memory cells MC determined to be a program fail is smaller than the number of permissible bits, the number of second current distribution units 1430_0 to 1430_m−1 that are turned on may be smaller than the number of first current distribution units 1420_0 to 1420_m−1 that are turned on. As a result, since the sensing current Ipb is lower than the reference current Iref, the comparison unit 1440 may generate the pass signal PASS of a high level. In contrast, if the number of memory cells MC determined to be a program fail is greater than the number of permissible bits, the number of second current distribution units 1430_0 to 1430_m−1 that are turned on may be greater than the number of first current distribution units 1420_0 to 1420_m−1. As a result, since the sensing current Ipb is higher than the reference current Iref, the comparison unit 1440 may generate the fail signal FAIL of a low level.

An operation of the memory device 150, in accordance with an embodiment of the present invention, is described below with reference to FIGS. 12 to 14. When a program verification operation is performed based on a set ECC criterion, if a program operation is determined to be successful as a result of the verification, the ECC criterion may be tightened and the verification operation may be performed again.

For example, the control circuit 1210 may set the number of permissible bits, which may be processed by the ECC circuit (not shown), as the ECC criterion and may determine bit values of the verification signal CB<0:m−1>. As a result, the pass/fail check circuit 1220 may perform program pass/fail check operations based on the determined verification signal CB<0:m−1> and generate the pass or fail signal PASS or FAIL. If the number of memory cells MC determined to be a program fail is greater than the number of permissible bits as described above, the pass/fail check circuit 1220 may generate the fail signal FAIL. In response to the fail signal FAIL, the control circuit 1210 may perform control so that a program voltage may be raised by a step voltage and program and verification operations and program pass/fail check operations may be performed.

In contrast, if the number of memory cells MC determined to be a program fail is smaller than the number of permissible bits through a continued program operation, the pass/fail check circuit 1220 generates the pass signal PASS. The control circuit 1210 may adjust the bit values of the verification signal CB<0:m−1> in response to the pass signal PASS and may perform control so that a verification operation is performed once more. For example, if the ECC circuit (not shown) processes a threshold of 100 bits as the permissible bits and a program operation based on the threshold of 100 bits is determined to be successful through a verification operation, the threshold may be reduced to 70 bits and a verification operation may be performed once more based on the tightened criterion.

In this case, pages determined to be a program fail may be managed by storing information on them in a state register (not shown). Accordingly, not only does a memory device verify a program operation of pages, the memory device may also separately manage pages that belong to verified pages but have a high risk of performance deterioration. Reference may be made to information about such pages when a victim block is selected in an operation, such as garbage collection. A method for selecting a victim block by checking the number of invalid pages in addition to pages having such a high risk is known in the art, and a detailed description thereof is omitted.

Figure 15:
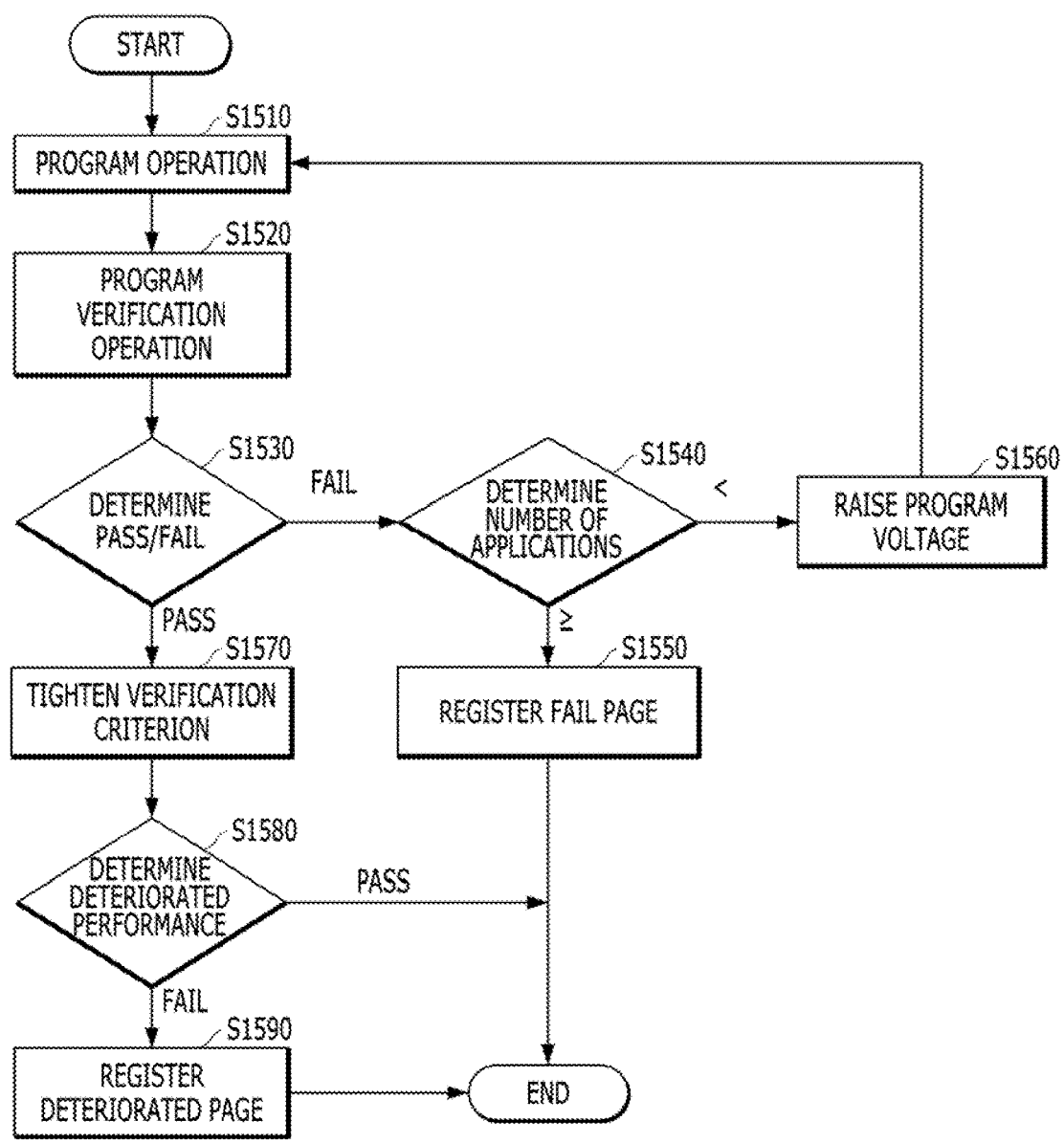
FIG. 15 is a diagram illustrating an overall operation of the memory device of FIG. 12, according to an embodiment of the present invention.

FIG. 15 is a flow chart illustrating an overall operation of the memory device 150 of FIG. 12 according to an embodiment of the present invention.

1) A Program Operation S1510

First, the voltage supply circuit 310 may start a program operation by applying a program voltage to word lines (e.g., WL0) of the memory block 152 under the control of the control circuit 1210. At this time, the plurality of page buffers PB of the read/write circuit 320 may store program data and change the potentials of respective bit lines BL in response to the stored program data. Accordingly, the memory cells MC0 coupled to the word lines WL0 may be programmed in response to the potentials of the respective bit lines BL.

2) A Program Verification Operation S1520

The voltage supply circuit 310 may apply a verification voltage to the word lines WL0 of the memory block 152 under the control of the control circuit 1210. The plurality of page buffers PB of the read/write circuit 320 may verify the program state of the memory cells MC0. In this case, the page buffer PB may compare data, read from the memory cell MC0, with the latched program data and change the potential of a corresponding sense node SN.

3) Determine a Pass or Fail PASS or FAIL at Step S1530

The pass/fail check circuit 1220 may count the number of memory cells MC0 determined to be a program fail, compare the counted number of memory cells MC0 with a permissible criterion in an ECC operation, and perform pass/fail check operations. If, as a result of the determination at step S1530, the number of memory cells MC0 determined to be a program fail is greater than the permissible criterion, the pass/fail check circuit 1220 may generate the fail signal FAIL, and then the number of applications of the program pulses is determined at step S1540. If, as a result of the determination at step S1530, however, the number of memory cells MC0 determined to be a program fail is smaller than the permissible criterion, the pass/fail check circuit 1220 may generate the pass signal PASS, and thus a verification criterion is tightened at step S1570.

4) Determine the Number of Applications of the Program Pulses at Step S1540

If, as a result of the determination at step S1530, the program operation is determined to be a fail, the number of program voltages applied may be counted and compared with a preset number at step S1540. If, as a result of the comparison, the number of program voltages applied is found to be equal to or greater than (i.e., ≥) the preset number, a corresponding page may be treated as being a program fail page at step S1550, and the program operation may be terminated. That is, when the program voltage is raised and applied in accordance with an ISPP method, a program operation may be repeatedly performed within the preset maximum number of iterations.

5) Raise a Program Voltage at Step S1560

If, as a result of the comparison at step S1540, the number of program voltages applied is found to be smaller than (i.e., <) the preset number, the program voltage may be raised by a step voltage, and the program operation S1510 may be performed. The program operation S1510 and the program verification operation S1520 may be repeated based on a result of the determination at step S1530 and a result of the determination at step S1540.

6) Tighten a Verification Criterion at Step S1570

If, as a result of the determination at step S1530, the program operation is determined to be a pass, the control circuit 1210 may tighten the permissible criterion of the pass/fail check circuit 1220. The control circuit 1210 may tighten the permissible criterion of the pass/fail check circuit 1220 by reducing the number of activated bit values of the verification signal CB<0:m−1.

7) Determine Deteriorated Performance (S1580)

The pass/fail check circuit 1220 may determine deteriorated performance of a page whose program operation has been completed (or successful) based on the tightened permissible criterion. If the number of memory cells MC0 determined to be a program fail in the corresponding page satisfies the tightened criterion, the program operation may be finally determined to be successful and thus terminated. If the number of memory cells MC0 determined to be a program fail in the corresponding page satisfies a program verification criterion, but does not satisfy the tightened criterion for determining deteriorated performance, the corresponding page may be treated as being a deteriorated page and separately managed at step S1590. In this case, program/read operations may continue to be performed on the corresponding page unlike in a fail page because the program operation has been successfully performed on the corresponding page.

As described above, the state of memory cells may be regularly checked without a separate read operation through a pass/fail check operation for a program operation in accordance with an embodiment of the present invention. In the present embodiment, a program operation has been illustrated as a way of an example. However, it is noted that the present invention may also be applied to an erase operation. In this case, the erase operation may be similar to the program operation except that the erase operation may be performed for each memory block and an erase pass or fail for each memory block is checked. Hence, a detailed description related to an erase operation is not needed. Accordingly, read latency may be reduced without increasing firmware overhead.

Furthermore, if a program/erase verification criterion is set based on a deterioration situation in addition to a normal situation, it may be expected what performance a memory cell will have when it is deteriorated although the memory cell is now in a pass state. Accordingly, the retention characteristic and reliability of a memory cell may be improved because a data error is detected and prevented in advance.

This technology has an advantage in that it may improve reliability of memory cells without a separate read operation because the state of the memory cells is regularly checked through verification operations according to program/erase operations performed on the memory cells.

That is, a data error may be detected in advance by predicting performance of memory cells when the memory cells are deteriorated without increasing firmware overhead.

Although various embodiments have been described for illustrative purposes, it will be apparent to those skilled in the art that various changes and modifications may be made without departing from the spirit and/or scope of the invention as defined in the following claims.

What is claimed is:

1. A memory device, comprising:
a plurality of memory blocks each memory block comprising a plurality of memory cells;
a read/write circuit suitable for reading data of a first group of memory cells of the plurality of memory cells and for verifying a program operation for each of the memory cells of the first group of memory cells;
a pass/fail check circuit suitable for comparing a first reference bit number with a number of first memory cells among the first group of memory cells which are verified as being a program fail as a result of a verification operation of the read/write circuit, and for checking whether the first group of memory cells is a pass or fail; and
a control circuit suitable for controlling the pass/fail check circuit to recheck whether the first group of memory cells is a pass or fail based on a second reference bit number smaller than the first reference bit number when the first group of memory cells is found to be the pass as a result of a pass/fail check operation of the pass/fail check circuit.

2. The memory device of claim 1, further comprising:
a voltage supply circuit suitable for applying program/verification voltages to the first group of memory cells of the plurality of memory cells for the program/verification operations for the first group of memory cells,
wherein the control circuit controls the voltage supply circuit to raise the program voltage by a step voltage so that the program/verification and pass/fail check operations are performed on the first group of memory cells again when the first group of memory cells is found to be the fail as the result of the pass/fail check operation of the pass/fail check circuit.

3. The memory device of claim 2, wherein the control circuit treats the first group of memory cells as being a program fail page when the first group of memory cells continue to be found to be the fail while a preset number of the program/verification and pass/fail check operations are repeated.

4. The memory device of claim 1, wherein the read/write circuit includes:
   a plurality of page buffers coupled to the first group of memory cells through bit lines, respectively, and coupled to respective sense nodes of the pass/fail check circuit.

5. The memory device of claim 4, wherein each of the plurality of page buffers reads data programmed into a memory cell coupled to the page buffer through the corresponding bit line, compares the read data with data latched in the page buffer, and changes a potential of the corresponding sense node based on a result of the comparison.

6. The memory device of claim 4, wherein the pass/fail check circuit includes:
   a reference current generation unit suitable for generating a reference current in response to a verification signal of plural bits;
   a sensing current generation unit suitable for generating a sensing current in response to potentials of the sense nodes; and
   a comparison unit suitable for comparing the sensing current with the reference current and generating a pass or fail signal.

7. The memory device of claim 6, wherein the control circuit initially enables bits of the first reference bit number, among the plural bits of the verification signals.

8. The memory device of claim 7, wherein the control circuit enables bits of the second reference bit number, among the plural bits of the verification signal in response to the pass signal outputted by the comparison unit.

9. The memory device of claim 1, wherein the pass/fail check circuit:
   determines the first group of memory cells to be the pass if the number of the first memory cells is smaller than the first reference bit number; and
   determines the first group of memory cells to the fail if the number of the first memory cells is greater than the first reference bit number.

10. The memory device of claim 1, wherein the control circuit registers and manages the first group of memory cells as a page having a high risk of performance deterioration when the first group of memory cells is found to be the fail again based on the second reference bit number.

11. The memory device of claim 10, wherein a victim block is selected with reference to the page having the high risk when performing a garbage collection operation.

12. A memory device, comprising:
   a plurality of memory blocks each comprising a plurality of memory cells;
   a read/write circuit suitable for reading data of the plurality of memory cells of each of the memory blocks and verifying an erase operation for the memory block;
   a pass/fail check circuit suitable for comparing a first reference bit number with a number of first memory cells among the plurality of memory cells which are verified as being an erase fail as a result of a verification operation of the read/write circuit, and checking whether the memory block is a pass or fail; and
   a control circuit suitable for controlling the pass/fail check circuit to recheck whether the memory block is a pass or fail based on a second reference bit number smaller than the first reference bit number when the memory block is found to be the pass as a result of a pass/fail check operation of the pass/fail check circuit.

13. The memory device of claim 12, further comprising:
   a voltage supply circuit suitable for applying erase/verification voltages for the erase/verification operations for the memory block,
   wherein the control circuit controls the voltage supply circuit to raise the erase voltage by a step voltage so that the erase/verification and pass/fail check operations are performed on the memory block again when the memory block is found to be the fail as the result of the pass/fail check operation of the pass/fail check circuit.

14. The memory device of claim 12, wherein the control circuit registers and manages the memory block as a block having a high risk of performance deterioration when the memory block is found to be the fail again based on the second reference bit number.

15. An operating method of a memory device, comprising:
   programming first group of memory cells of a plurality of memory cells by applying a program voltage thereto;
   verifying a program state of each of the first group of memory cells;
   comparing a first reference bit number with a number of first memory cells which are verified as being a program fail as a result of the verifying of the program state, among the first group of memory cells, and checking whether the first group of memory cells is a pass or fail; and
   rechecking whether the first group of memory cells is a pass or fail based on a second reference bit number smaller than the first reference bit number when the first group of memory cells is found to be the pass as a result of the checking of the first group of memory cells.

16. The operating method of claim 15, further comprising:
   counting a number of the program voltages applied when the first group of memory cells is found to be the fail as the result of the checking of the first group of memory cells,
   wherein the program voltage is raised by a step voltage and the programming of the first group of memory cells, the verifying of the program state, and the checking of the first group of memory cells are repeated, when the number of program voltages applied is smaller than a preset number.

17. The operating method of claim 16, wherein the checking of the first group of memory cells comprises:
   generating a sensing current corresponding to the number of the first memory cells;
   generating a reference current corresponding to the first reference bit number; and
   comparing the sensing current with the reference current and generating a pass or fail signal.

18. The operating method of claim 17, wherein the comparing of the sensing current with the reference current and the generating of the pass or fail signal comprises:
   generating the fail signal when the sensing current is found to be greater than the reference current; and
   generating the pass signal when the sensing current is found to be smaller than the reference current.

19. The operating method of claim 15, further comprising:
   registering and managing the first group of memory cells as a page having a high risk of performance deterioration when the first group of memory cells is found to be the fail again based on the second reference bit number.

20. The operating method of claim 19, further comprising:
   selecting a victim block with reference to the page having the high risk when performing a garbage collection operation.

* * * * *